US010046969B2

(12) United States Patent
Shibuya et al.

(10) Patent No.: US 10,046,969 B2
(45) Date of Patent: Aug. 14, 2018

(54) DEVICE FOR MANUFACTURING AND METHOD FOR MANUFACTURING ORIENTED CARBON NANOTUBE AGGREGATES

(75) Inventors: Akiyoshi Shibuya, Tokyo (JP); Kenji Hata, Tsukuba (JP); Motoo Yumura, Tsukuba (JP)

(73) Assignees: ZEON CORPORATION, Tokyo (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 245 days.

(21) Appl. No.: 14/236,133

(22) PCT Filed: Aug. 23, 2012

(86) PCT No.: PCT/JP2012/071313
§ 371 (c)(1),
(2), (4) Date: Jan. 30, 2014

(87) PCT Pub. No.: WO2013/027797
PCT Pub. Date: Feb. 28, 2013

(65) Prior Publication Data
US 2014/0170316 A1 Jun. 19, 2014

(30) Foreign Application Priority Data
Aug. 24, 2011 (JP) .................................. 2011-183130

(51) Int. Cl.
*C23C 16/00* (2006.01)
*C01B 31/02* (2006.01)
(Continued)

(52) U.S. Cl.
CPC ......... *C01B 31/0226* (2013.01); *B01J 23/745* (2013.01); *B82Y 30/00* (2013.01);
(Continued)

(58) Field of Classification Search
CPC .................................................. C23C 16/26
See application file for complete search history.

(56) References Cited

U.S. PATENT DOCUMENTS

2002/0012749 A1* 1/2002 von Campe ........ C23C 16/4412
427/314
2010/0062157 A1 3/2010 Hata et al.
(Continued)

FOREIGN PATENT DOCUMENTS

EP   1 739 058 A1   1/2007
JP   02114530 A *   4/1990 ........... C23C 16/452
(Continued)

OTHER PUBLICATIONS

Apr. 2, 2015 Extended Search Report issued in European Application No. 12825509.8.
(Continued)

*Primary Examiner* — David P Turocy
(74) *Attorney, Agent, or Firm* — Oliff PLC

(57) ABSTRACT

An apparatus of the present invention for producing an aligned carbon nanotube includes: at least one injection section including at least one injection hole from which a raw material gas is injected to a base substrate; an exhaust vent for exhausting the raw material gas; and an exhaust section including a plurality of exhaust vents, the plurality of exhaust vents being provided so as to be closer to the exhaust vent than a plurality of injection holes included in the at least one injection hole of the at least one injection section.

5 Claims, 7 Drawing Sheets

(51) Int. Cl.
*B01J 23/745* (2006.01)
*B82Y 30/00* (2011.01)
*B82Y 40/00* (2011.01)
*C23C 16/44* (2006.01)
*C23C 16/455* (2006.01)
*C01B 32/05* (2017.01)
*C01B 32/16* (2017.01)

(52) U.S. Cl.
CPC ............. *B82Y 40/00* (2013.01); *C01B 32/05* (2017.08); *C01B 32/16* (2017.08); *C23C 16/4412* (2013.01); *C23C 16/45578* (2013.01); *C01B 2202/08* (2013.01); *C01B 2202/30* (2013.01); *C01B 2202/32* (2013.01)

(56) References Cited

U.S. PATENT DOCUMENTS

| | | | |
|---|---|---|---|
| 2010/0129274 A1 | 5/2010 | Jeong et al. | |
| 2010/0196600 A1* | 8/2010 | Shibuya | B82Y 30/00 427/249.1 |
| 2011/0097494 A1* | 4/2011 | Kerr | C23C 16/45551 427/255.5 |
| 2012/0107220 A1 | 5/2012 | Shibuya et al. | |
| 2012/0141676 A1* | 6/2012 | Sershen | C23C 16/45551 427/255.23 |

FOREIGN PATENT DOCUMENTS

| | | | |
|---|---|---|---|
| JP | 2001-262351 A | | 9/2001 |
| JP | 2001262351 A | * | 9/2001 |
| JP | A-2007-126318 | | 5/2007 |
| JP | A-2008-137831 | | 6/2008 |
| JP | A-2011-148658 | | 8/2011 |
| WO | WO 2008/096699 A1 | | 8/2008 |
| WO | WO 2009/128349 A1 | | 10/2009 |
| WO | WO 2010/147192 A1 | | 12/2010 |
| WO | WO 2011/001969 A1 | | 1/2011 |

OTHER PUBLICATIONS

Hata et al., "Water-Assisted Highly Efficient Synthesis of Impurity-Free Single-Walled Carbon Nanotubes," *Science*, Nov. 19, 2004, vol. 306, pp. 1362-1364.

International Search Report issued in International Patent Application No. PCT/JP2012/071313 dated Oct. 2, 2012.

* cited by examiner

|    | x1  | x2  | x3  | x4  | x5  |
|----|-----|-----|-----|-----|-----|
| y1 | 8.4 | 7.7 | 5.8 | 6.3 | 5.9 |
| y2 | 9.4 | 7.3 | 7.0 | 7.3 | 5.8 |
| y3 | 8.7 | 7.6 | 6.2 | 7.0 | 5.7 |
| y4 | 6.0 | 7.4 | 7.1 | 6.6 | 5.3 |
| y5 | 7.7 | 9.2 | 6.5 | 7.2 | 5.2 |

TRANSFER DIRECTION →

|    | x1  | x2  | x3  | x4  | x5  |
|----|-----|-----|-----|-----|-----|
| y1 | 8.3 | 8.5 | 6.1 | 5.8 | 5.6 |
| y2 | 7.8 | 7.2 | 6.7 | 6.6 | 6.4 |
| y3 | 9.1 | 7.6 | 7.1 | 6.5 | 6.3 |
| y4 | 7.7 | 8.2 | 6.9 | 6.5 | 6.0 |
| y5 | 8.6 | 7.4 | 6.2 | 5.5 | 5.5 |

TRANSFER DIRECTION ↑

|    | x1  | x2  | x3  | x4  | x5  |
|----|-----|-----|-----|-----|-----|
| y1 | 7.5 | 8.3 | 6.0 | 7.8 | 6.8 |
| y2 | 7.5 | 6.9 | 6.7 | 8.5 | 7.0 |
| y3 | 8.2 | 7.4 | 6.9 | 8.3 | 7.6 |
| y4 | 7.2 | 8.0 | 6.9 | 8.3 | 6.9 |
| y5 | 8.5 | 7.2 | 6.0 | 7.5 | 5.7 |

TRANSFER DIRECTION ↑

DEVICE FOR MANUFACTURING AND METHOD FOR MANUFACTURING ORIENTED CARBON NANOTUBE AGGREGATES

TECHNICAL FIELD

The present invention relates to an apparatus for producing an aligned carbon nanotube aggregate and a method for producing the aligned carbon nanotube aggregate.

BACKGROUND ART

Various techniques for producing a carbon nanotube (hereinafter referred to as "CNT") aggregate have been reported.

Patent Literature 1 and Non-patent Literature 1 describe methods for producing CNTs with use of a CVD method.

Patent Literature 2 describes a CNT production apparatus in which a direction in which a raw material gas is injected is adjusted to a direction in which CNTs grown from a metal catalyst film are aligned.

Patent Literature 3 describes an apparatus for producing an aligned CNT aggregate, the apparatus including (i) a seal gas injection section which injects a seal gas along an aperture plane of a growth furnace through which aperture plane a base substrate is taken out of the growth furnace and (ii) an exhaust section which exhausts air so as to prevent the seal gas from entering the growth furnace.

Patent Literature 4 describes a CNT production method which is intended to uniformly produce CNTs on a large area base substrate.

Patent Literature 5 describes a CNT production method which is intended to cause CNTs to have a long fiber length without inhibiting supply of a raw material gas to a catalyst supporting surface.

CITATION LIST

Patent Literatures

Patent Literature 1
Pamphlet of International Publication, No. WO 2009/128349
Patent Literature 2
Pamphlet of International Publication, No. WO 2008/096699
Patent Literature 3
Pamphlet of International Publication, No. WO 2011/001969
Patent Literature 4
Japanese Patent Application Publication, Tokukai, No. 2008-137831 A
Patent Literature 5
Japanese Patent Application Publication, Tokukai, No. 2007-126318 A

Non-Patent Literature

Non-Patent Literature 1
Kenji Hata et al., Water-Assisted Highly Efficient Synthesis of Impurity-Free Single-Walled Carbon Nanotubes, SCIENCE, 2004.11.19, Vol. 306, pp. 1362-1364

SUMMARY OF INVENTION

Technical Problem

However, according to the conventional techniques, there occurs a problem such that a base substrate which has such a large area as to have a side length of 10 cm or larger causes a deterioration in quality of CNTs to be obtained in a rim of the base substrate.

The present invention, which has been made in view of the above problem, provides an apparatus for producing an aligned CNT aggregate and a method for producing the aligned CNT aggregate, the apparatus and the method each capable of preventing a deterioration in quality of the aligned CNT aggregate in a rim of a base substrate even in a case where a large area base substrate is used as the base substrate.

Solution to Problem

Inventors of the present invention expect that concentration unevenness of a raw material gas occurs on a base substrate due to the following two reasons and the occurrence of the concentration unevenness causes a deterioration in quality of CNTs in a rim of the base substrate. Note that, in a case where a catalyst activation material as well as the raw material gas is supplied to the base substrate, concentration unevenness of the catalyst activation material is also expected to occur.

1: A difference in gas flow velocity increases from a center towards the rim of the base substrate in proportion to an area of the base substrate.

2: A raw material gas and/or a catalyst activation material (residual gas) which have/has been consumed at the center of the base substrate in synthesizing the CNTs and consequently have/has a lower concentration flow towards the rim of the base substrate while flowing in a space between the base substrate and an injection hole(s).

The inventors of the present invention made the following findings: (i) that, in a case where a plurality of exhaust vents are provided behind injection holes of an injection section (shower) that injects a raw material gas and/or a catalyst activation material, it is possible to exhaust a residual gas out of a furnace fast by preventing, as much as possible, a flow of the residual gas in a space between a base substrate and the injection holes and (ii) that the fast exhaust of the residual gas allows a gas composition and a gas flow velocity to be more uniform on the entire surface of the base substrate, so that CNTs having more uniform quality can be synthesized on a large area base substrate. Based on the findings, the inventors accomplished the present invention.

That is, an apparatus of the present invention for producing an aligned carbon nanotube aggregate is an apparatus for producing an aligned carbon nanotube aggregate by synthesizing the aligned carbon nanotube aggregate on a base substrate that supports a catalyst on a surface thereof, the apparatus including: a growth unit for synthesizing the aligned carbon nanotube aggregate on the base substrate by supplying a raw material gas for carbon nanotubes to the catalyst and heating at least either the catalyst or the raw material gas, the growth unit including: at least one injection section including at least one injection hole from which the raw material gas is injected to the base substrate; a first exhaust vent being on one side, relative to the at least one injection section, while a mounting surface on which the base substrate is placed is on the other side relative to the injection section, for exhausting, out of a growth furnace, the raw material gas that was injected from the at least one injection hole and then contacted the base substrate, the growth furnace storing the base substrate while the aligned carbon nanotube aggregate is being synthesized; and an exhaust section including a plurality of second exhaust vents that exhausts, towards the first exhaust vent, the raw material gas that contacted the base substrate, the plurality of second exhaust vents being provided so as to be closer to the first exhaust vent than a plurality of injection holes included in the at least one injection hole of the at least one injection section.

Further, a method of the present invention for producing an aligned carbon nanotube aggregate is a method for producing an aligned carbon nanotube aggregate by synthesizing the aligned carbon nanotube aggregate on a base substrate that supports a catalyst on a surface thereof, the method including: a growth step of synthesizing the aligned carbon nanotube aggregate on the base substrate by supplying a raw material gas for carbon nanotubes to the catalyst and heating at least either the catalyst or the raw material gas, the growth step being carried out by a growth unit, the growth unit including: at least one injection section including at least one injection hole from which the raw material gas is injected to the base substrate; a first exhaust vent being on one side, relative to the at least one injection section, while a mounting surface on which the base substrate is placed is on the other side relative to the injection section, for exhausting, out of a growth furnace, the raw material gas that was injected from the at least one injection hole and then contacted the base substrate, the growth furnace storing the base substrate while the aligned carbon nanotube aggregate is being synthesized; and an exhaust section including a plurality of second exhaust vents that exhausts, towards the first exhaust vent, the raw material gas that contacted the base substrate, the plurality of second exhaust vents being provided so as to be closer to the first exhaust vent than a plurality of injection holes included in the at least one injection hole of the at least one injection section.

According to the configuration, the plurality of second exhaust vents remove a residual gas from a space between the base substrate and the injection holes before exhausting the residual gas from the entire growth unit. The residual gas is a residual substance of the raw material gas or the raw material gas and a catalyst activation material which is/are obtained after being supplied to the base substrate and used for synthesizing CNTs. Therefore, the residual gas has a lower concentration than the raw material gas supplied from the injection holes. Further, in a case where the raw material gas includes the catalyst activation material, the catalyst activation material also has a lower concentration. According to the configuration, such a residual gas does not remain in the space between the base substrate and the injection holes. Therefore, the raw material gas to be supplied to the base substrate has a more uniform concentration. Further, in a case where the catalyst activation material is also supplied, the catalyst activation material also has a more uniform concentration. This can prevent a deterioration in quality of CNTs in a rim of the base substrate even in a case where a large area substrate is used as the base substrate.

Advantageous Effects of Invention

According to the present invention, it is possible to bring about an effect of providing an apparatus for producing an aligned CNT aggregate which apparatus is capable of preventing a deterioration in quality of the aligned CNT aggregate in a rim of a base substrate even in a case where a large area base substrate is used as the base substrate.

DESCRIPTION OF EMBODIMENTS

Figure 1:
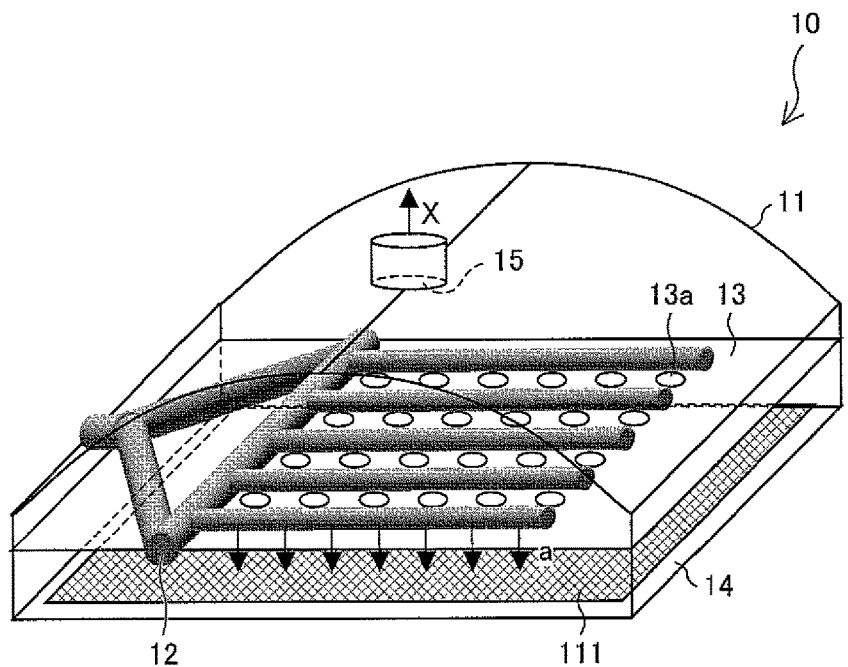
FIG. 1 is a view schematically showing a configuration of a growth unit of an aligned CNT aggregate production apparatus in accordance with Embodiment 1 of the present invention.

Embodiments of the present invention are specifically described below.

(Aligned CNT Aggregate)

First, the following description discusses an aligned CNT aggregate obtained from an aligned CNT aggregate production apparatus in accordance with the present invention (hereinafter simply referred to as a "production apparatus of the present invention").

An aligned CNT aggregate that is produced by a production apparatus of the present invention refers to a structure in which a large number of CNTs having grown from a substrate are aligned along a particular direction. A specific surface area of the aligned CNT aggregate when the CNTs are mostly unopened is preferably not less than 600 $m^2/g$, and more preferably not less than 800 $m^2/g$. An aligned CNT aggregate having a larger specific surface area is preferable because such an aligned CNT aggregate can reduce an amount of impurities such as metals or carbon impurities. A total amount of the impurities is preferably not more than 40% of a CNT weight.

A weight density of the aligned CNT aggregate is preferably not less than 0.002 $g/cm^3$ and not more than 0.2 $g/cm^3$. In a case where the weight density is not more than 0.2 $g/cm^3$, there will be a weakening in binding of CNTs constituting the aligned CNT aggregate. Such a weakening renders the aligned CNT aggregate likely to be homogenously dispersed when stirred into a solvent or the like. That is, a weight density of not more than 0.2 $g/cm^3$ makes it easy to obtain a homogenous dispersion liquid. Alternatively, a weight density of not less than 0.002 $g/cm^3$ leads to an improvement in the integrity of the aligned CNT aggregate. Such an improvement can prevent the aligned CNT aggregate from being unbound, thus making it easy to handle the aligned CNT aggregate.

An aligned CNT aggregate which is aligned along a particular direction preferably has a high degree of orientation. The high degree of orientation can be evaluated by at least any one of the following 1. to 3.

1. In a case where the aligned CNT aggregate is irradiated with X rays from a first direction parallel with the longitudinal direction of the CNTs and from a second direction perpendicular to the first direction, and an x-ray diffraction intensity of the aligned CNT aggregate is then measured (by θ-2θ method), a θ angle and a reflection direction where a reflection intensity from the second direction is greater than that from the first direction are obtained. Further, a θ angle and a reflection direction where the reflection intensity from the first direction is greater than that from the second direction are obtained.

2. In a case where an X-ray diffraction intensity is measured from a two-dimensionally diffraction pattern image obtained by irradiating the aligned CNT aggregate with X rays from the direction perpendicular to the longitudinal direction of the CNTs (by Laue method), a diffraction peak pattern indicating presence of anisotropy appears.

3. A Herman's orientation factor calculated on the basis of the X-ray diffraction intensity obtained by θ-2θ method or Laue method is more than 0 and less than 1, preferably not less than 0.25 and not more than 1.

According to the X-ray diffraction method, (i) diffraction intensities of a (CP) diffraction peak and a (002) peak based on packing between the single-walled CNTs, and (ii) a diffraction peak intensity in a direction of X-rays that enter parallel and perpendicular to (100) and (110) peaks based on a six-membered carbon ring constituting the single-walled CNTs are different from each other.

In order for an aligned CNT aggregate to exhibit orientation and a large specific surface area, it is preferable that the height of the aligned CNT aggregate be in a range of not less than 10 μm and not more than 10 cm. A height of not less than 10 μm leads to an improvement in orientation. Alternatively, a height of not more than 10 cm makes it possible to improve the specific surface area, because such a height makes rapid generation possible and the adhesion of carbonaceous impurities can therefore be controlled. Note that the "height" can be regarded as a length of the aligned CNT aggregate.

The aligned CNT aggregate preferably has a G/D ratio of not less than 3, and more preferably of not less than 4. The term "G/D ratio" means an index that is commonly used to evaluate the quality of CNTs. A raman spectrum of CNTs as measured by a raman spectroscopic instrument is observed in vibration modes called "G band" (near 1,600 $cm^{-1}$) and "D band" (near 1,350 $cm^{-1}$). The G band is a vibration mode derived from hexagonal lattice structures of graphite appearing as cylindrical surfaces of CNTs, and the D band is a vibration mode derived from amorphous parts. Therefore, with a higher peak intensity ratio of the G band to the D band (G/D ratio), the CNTs can be evaluated to be higher in crystallinity.

Embodiment 1

Figure 2:
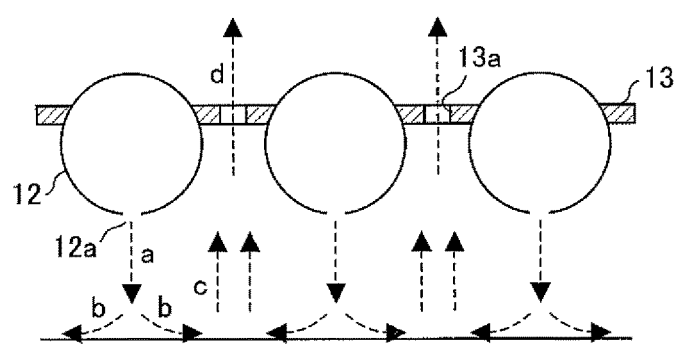
FIG. 2 is a view schematically showing how a raw material gas flows in the growth unit of Embodiment 1.

An embodiment of a growth unit included in a production apparatus of the present invention is described with reference to FIGS. 1 and 2. FIG. 1 is a view schematically showing a configuration of a growth unit 10 of an aligned CNT aggregate production apparatus in accordance with Embodiment 1. FIG. 2 is a view schematically showing how a raw material gas flows in the growth unit 10.

The growth unit 10 includes a growth furnace 11, an injection section 12, and an exhaust section 13. The growth unit 10 further has an exhaust vent 15 (first exhaust vent) provided in an upper part thereof. The growth unit 10 further includes a heater 16, which is described later.

The growth unit 10 is a set of devices for carrying out a growth step. The growth unit 10 has a function of, by carrying out the growth step, synthesizing an aligned CNT aggregate by (i) causing an environment surrounding a catalyst to be an environment of a raw material gas and (ii) heating at least either the catalyst or the raw material gas.

(Growth Step)

First, the following description discusses the growth step, which is carried out by the growth unit included in the production apparatus of the present invention.

The growth step is a step of synthesizing an aligned CNT aggregate by (i) transferring a base substrate into a growth furnace, (ii) causing an environment surrounding a catalyst to be an environment of a raw material gas in the growth furnace, and (iii) heating at least either the catalyst or the raw material gas. That is, in the growth step, the aligned carbon nanotube aggregate is synthesized on the base substrate by, for example, a chemical vapor deposition (CVD) method.

For example, it is only necessary that in the growth step, the aligned CNT aggregate be synthesized on the base substrate by the CVD method after or while the raw material gas for a CNT is supplied to the growth furnace into which the base substrate is being transferred.

It is more preferable that the growth step be carried out in the presence of a catalyst activation material in an atmosphere in which the CNT growth reaction is carried out. The addition of the catalyst activation material makes it possible to further improve the efficiency in the production of CNTs and the purity of the CNTs.

In the case of heating at least either the catalyst or the raw material gas, it is more preferable to heat both the catalyst and the raw material gas. It is only necessary that a temperature at which the catalyst and/or the raw material gas allow CNTs to grow. The temperature is preferably not less than 400° C. and not more than 1,100° C., and is more preferably not less than 600° C. and not more than 900° C. Particularly in a case where the catalyst activation material is added, the temperature falling within the above range allows an effect of the catalyst activation material to be expressed well and makes it possible to prevent the catalyst activation material from reacting with CNT.

The growth step is carried out at a pressure preferably of not lower than $10^2$ Pa and not higher than $10^7$ Pa (100 in atmospheric pressure), or more preferably of not lower than $10^4$ Pa and not higher than $3\times10^5$ Pa (3 in atmospheric pressure).

(Raw Material Gas)

As a raw material gas, any substance that can be a raw material for CNTs can be used. For example, gases having raw-material carbon sources at the growth temperature can be used. Among them, hydrocarbons such as methane, ethane, ethylene, propane, butane, pentane, hexane, heptane, propylene, and acetylene are suitable. In addition, lower alcohols such as methanol and ethanol, and mixtures thereof can be used. Further, the raw material gas may be diluted with an inert gas.

(Inert Gas)

The inert gas only needs to be a gas that is inert at the temperature at which CNTs grow, does not cause a decrease in activity of the catalyst, and does not react with the growing CNTs. Examples that can be given are helium, argon, nitrogen, neon, krypton, and mixtures thereof. In particular, nitrogen, helium, argon, and mixtures thereof are suitable.

(Catalyst Activation Material)

It is more preferable that the growth step be carried out in the presence of a catalyst activation material in an atmosphere in which the CNT growth reaction is carried out. The catalyst activation material is more preferably an oxygen-containing substance, and is still more preferably a substance that does no significant damage to CNTs at the CNT growth temperature. Effective examples include: water, oxygen, ozone, acidic gases, nitrogen oxide; low-carbon oxygen-containing compounds such as carbon monoxide and carbon dioxide; alcohols such as ethanol and methanol; ethers such as tetrahydrofuran; ketones such as acetone; aldehydes; esters; and mixtures of thereof. Among them, water, oxygen, carbon dioxide, carbon monoxide, and ethers are preferable. In particular, water and carbon dioxide are suitable.

The catalyst activation material is not particularly limited in amount to be added. However, when the catalyst activation material is water, the catalyst activation material only needs to be added in a range preferably of not less than 10 ppm and not more than 10,000 ppm, more preferably of not less than 50 ppm and not more than 1,000 ppm, and still more preferably of not less than 200 ppm and not more than 700 ppm, in a concentration in an environment surrounding the catalyst. Further, carbon dioxide which is used as the catalyst activation material has a concentration preferably of not less than 0.2% by volume and not more than 70% by volume, more preferably of not less than 0.3% and not more than 50% by volume, and still more preferably of not less than 0.7% by volume and not more than 20% by volume.

The mechanism by which the catalyst activation material functions is currently supposed to be as follows: In the process of growth of CNTs, adhesion of by-products such as amorphous carbon and graphite to the catalyst causes deactivation of the catalyst and the growth of CNTs is therefore inhibited. However, the presence of the catalyst activation material causes amorphous carbon and graphite to be oxidized into carbon monoxide, carbon dioxide, or the like and therefore gasified. Therefore, the catalyst activation material is believed to cleanse a catalyst layer and express a catalyst activation function, that is, a function of enhancing the activity of the catalyst and extending the active longevity of the catalyst.

Note that compounds containing carbon and oxygen such as alcohols and carbon monoxide can act as both a raw material gas and a catalyst activation material. For example, it is expected the alcohols and the compounds each containing carbon and oxygen act as catalyst activation materials when used in combination with a raw material gas that is easily decomposed to be a carbon source (e.g., ethylene). Meanwhile, it is expected the alcohols and the compounds each containing carbon and oxygen act as raw material gases when used in combination with a catalyst activation material having a high activity (e.g., water). Furthermore, it is expected, in the case of, for example, carbon monoxide, that carbon atoms which are generated by being decomposed serve as carbon sources of the CNT growth reaction, whereas oxygen atoms act as catalyst activation materials which gasify, by oxidization, amorphous carbon, graphite, and the like.

(High-Carbon-Concentration Environment)

It is preferable that a raw material gas atmosphere be a high-carbon-concentration environment. Specifically, the high-carbon-concentration environment is a growth atmosphere in which the proportion of the raw material gas to the total flow is preferably 2 to 20%. Since the activity of the catalyst is remarkably improved particularly in the presence of the catalyst activation material, the catalyst is not deactivated even in an environment of high-carbon concentration. Thus, long-term growth of CNTs is made possible, and the growth rate is remarkably improved. However, in an environment of high-carbon concentration, a large amount of carbon contaminants easily adhere to a furnace wall and the like, as compared with an environment of low-carbon concentration. According to the production apparatus of the present invention, it is possible to efficiently exhaust a residual gas. This allows the production apparatus of the present invention to be excellent in productivity of the aligned CNT aggregate.

[Base Substrate 111]

Next, the following description discusses a base substrate 111 to be used in the growth step. The base substrate 111 is a substrate having a base substrate that supports thereon a catalyst for a growth reaction of CNTs.

It is only necessary that a base substrate constituting the base substrate 111 be a member capable of supporting a catalyst for a CNT growth on a surface thereof. The base substrate can preferably maintain its shape even at a high temperature of not lower than 400° C. Examples of materials usable for the base substrate include: metals such as iron, nickel, chromium, molybdenum, tungsten, titanium, aluminum, manganese, cobalt, copper, silver, gold, platinum, niobium, tantalum, lead, zinc, gallium, indium, germanium, and antimony; alloys and oxides containing these metals; nonmetals such as silicon, quartz, glass, mica, graphite, and diamond; and ceramic. The metal materials, which are lower in cost than silicon and ceramic, are preferable. In particular, a Fe—Cr (iron-chromium) alloy, a Fe—Ni (iron-nickel) alloy, a Fe—Cr—Ni (iron-chromium-nickel) alloy, and the like are suitable.

The base substrate may take the form of a flat plate, a thin film, a block, or the like. However, in particular, the form of the flat plate in which form the base substrate has a large surface area for its volume is advantageous to mass production.

In a case where the base substrate 111 which takes the form of a flat plate is used, the base substrate 111 is not particularly limited in thickness. For example, it is possible to use, as the base substrate 111, a thin film having a thickness of approximately several μm to approximately several centimeters. The thickness is preferably not less than 0.05 mm and not more than 3 mm. The thickness of not more than 3 mm allows the base substrate 111 to be sufficiently heated in a CVD step. This can prevent insufficient growth of the CNTs and reduce cost of the base substrate 111. The thickness of not less than 0.05 mm prevents deformation of the base substrate 111 due to carburizing and makes it difficult for bending of the base substrate 111 itself to easily occur. This is advantageous in transferring and/or recycling the base substrate 111. Note that the term carburizing herein refers to infiltration of a carbon component into the base substrate 111.

The base substrate which takes the form of a flat plate form is not particularly limited in shape and size. However, it is possible to use, as the base substrate, a rectangular or square base substrate. The base substrate is not particularly limited in length of a side. However, a side having a longer length is more desirable in terms of mass productivity of CNTs. According to the present invention, a large-sized base substrate can be suitably used. For example, an aligned CNT aggregate can be produced more uniformly on a base substrate having a side of not less than 100 mm and not more than 1,000 mm.

(Carburizing Prevention Layer)

The base substrate 111 may have a carburizing prevention layer formed on at least either a front or back surface thereof. It is desirable that the base substrate 111 have a carburizing prevention layer formed on each of the front and back surfaces thereof. The carburizing prevention layer is a protecting layer for preventing the base substrate 111 from being carburized and therefore deformed in the step of generating carbon nanotubes.

It is preferable that the carburizing prevention layer be composed of a metal or ceramic material, or especially preferably the ceramic material, which is highly effective in preventing carburizing. Examples of the metal include copper and aluminum. Examples of the ceramic material include: oxides such as aluminum oxide, silicon oxide, zirconium oxide, magnesium oxide, titanium oxide, silica alumina, chromium oxide, boron oxide, calcium oxide, and zinc oxide; and nitrides such as aluminum nitride and silicon nitride. Among them, aluminum oxide and silicon oxide are preferable because they are highly effective in preventing carburizing.

(Catalyst)

The base substrate 111 supports a catalyst. In a case where the carburizing prevention layer is provided on the base substrate 111, the carburizing prevention layer supports the catalyst thereon. Examples of the catalyst include iron, nickel, cobalt, molybdenum, a chloride thereof, an alloy thereof, and a complex or layer thereof with aluminum, alumina, titania, titanium nitride, or silicon oxide. Examples that can be given are an iron-molybdenum thin film, an alumina-iron thin film, an alumina-cobalt thin film, an alumina-iron-molybdenum thin film, an aluminum-iron thin film, and an aluminum-iron-molybdenum thin film. The catalyst can be used in a range of existential quantities that is usable for production of CNTs. For example, in the case of use of iron, it is preferable that the thickness of a film formed be in a range of not less than 0.1 nm and not more than 100 nm, more preferably not less than 0.5 nm and not more than 5 nm, or especially preferably not less than 0.8 nm and not more than 2 nm.

It is possible to apply either a wet or dry process to the formation of the catalyst onto the surface of the base substrate. Specifically, it is possible to apply a sputtering evaporation method or a method for spreading/calcining a liquid obtained by dispersing fine metal particles in an appropriate solvent. Further, it is possible to form the catalyst into any shape with concomitant use of patterning obtained by applying well-known photolithography, nano-printing, or the like.

A production method of the present invention makes it possible to arbitrarily control the shape of an aligned CNT aggregate, according to the catalyst patterning formed on the substrate and the growth time for CNTs, so that the aligned CNT aggregate takes a thin-film shape, a cylindrical shape, a prismatic shape, or any other complicated shape. In particular, in the shape of a thin film, the aligned CNT aggregate has an extremely small thickness as compared with its length and width; however, the length and width can be arbitrarily controlled according to the catalyst patterning, and the thickness can be arbitrarily controlled according to the growth time for CNTs that constitute the aligned CNT aggregate. Note that the "thickness" can also be regarded as a height of the aligned CNT aggregate.

[Growth Furnace 11]

Next, the following description discusses members constituting the unit 10. The growth furnace 11 is a furnace for (i) retaining an environment of a raw material gas which environment surrounds a base substrate and (ii) storing the base substrate 111 while synthesizing an aligned carbon nanotube aggregate.

The growth furnace 11 has a bottom surface which serves as a mounting surface 14 on which the base substrate 111 is placed. During the growth step, the base substrate 111 is placed on the mounting surface 14.

The growth furnace 11 has the exhaust vent 15 provided in the upper part thereof. The exhaust vent 15 is on one side, relative to the injection section 12, while the mounting surface 14 on which the base substrate 111 is placed is on the other side relative to the injection section 12. The exhaust vent 15 is provided for exhausting a raw material gas that was injected from injection holes 12a and then contacted the base substrate 111. The raw material gas supplied from the injection section 12 is exhausted from the growth furnace 11 through the exhaust vent 15 via an exhaust section 13 (described later) in a direction indicated by an arrow X. It is possible to appropriately employ, as a mechanism for exhausting the raw material gas from the exhaust vent 15, a conventional method for sucking the raw material gas by suction means such as a pump.

According to the present embodiment, the exhaust vent 15 is an opening which is provided on an inner wall of the growth furnace 11 and connected to a pipe from which the raw material gas in the growth furnace 11 is exhausted. According to the production apparatus of the present invention, the first exhaust vent is on one side, relative to the injection section, while the mounting surface on which the base substrate is placed is on the other side relative to the injection section. The first exhaust vent is an opening from which to exhaust a raw material gas that was injected from injection holes and then contacted the base substrate. According to the present embodiment, the opening is provided on the inner wall of the growth furnace 11, and gas having passed through the opening is exhausted from the growth unit 10 through the pipe. However, configurations of the first exhaust vent and the pipe connected to the first exhaust vent are not limited to those of the present embodiment. For example, the first exhaust vent and the pipe connected to the first exhaust vent may be realized by a unit having the following configuration. That is, the unit (i) has a surface that corresponds to the exhaust section 13 (described later) and (ii) protrudes in side view by being provided with a pipe opposed to exhaust vents 13a. According to the unit having the configuration, an opening in which the pipe contacts a space containing gas having passed through the exhaust vents 13a corresponds to the first exhaust vent. The configuration makes it possible to easily obtain an advantage of the present invention by incorporating the unit into a conventional growth furnace.

Further, a configuration of the pipe of the present embodiment, which pipe has an end corresponding to the exhaust vent 15 and leads gas having passed through the exhaust vent 15, is not limited to the configuration which is illustrated in FIG. 1 and in which the pipe is opposed to the mounting surface 14 relative to the injection section 12. For example, the pipe may be configured to collect, in the first exhaust vent, gas having passed through second exhaust vents, and then exhaust the gas by inverting the pipe toward the mounting surface. In other words, according to the present embodiment, it is only necessary that the first exhaust vent be opposed to the mounting surface relative to the injection section. Further, (i) the pipe which is connected to the first exhaust vent and (ii) the opening which is an outlet of the pipe and from which gas is finally exhausted from the growth unit do not need to be opposed to the mounting surface relative to the injection section.

Further, the growth furnace 11 may include a reaction gas injection section. Furthermore, the pipe for leading, to an outside of the growth unit 10, the gas having passed through the exhaust vent 15 can include an exhaust flow volume stabilization section. A reaction gas and the exhaust flow volume stabilization section are described later.

[Injection Section 12]

The injection section 12 supplies a raw material gas to the base substrate 111. The injection section 12 may also be used as necessary to supply a catalyst activation material to the base substrate 111.

The injection section 12 includes pipes which are provided like a comb. The pipes are each provided with an injection hole row in which a plurality of injection holes 12a are aligned. In a case where the pipes each provided with the injection hole row are thus provided like a comb, it is possible to more uniformly supply a raw material gas and a catalyst activation material to the base substrate 111.

In a case where a base substrate which is 500 mm square is used as the base substrate 111 and the growth furnace 11 has a height of 300 mm, it is more preferable that the injection section 12 be at a height of not less than 10 mm and not more than 100 mm above the mounting surface 14.

The injection holes 12a are provided in a place facing a surface of the base substrate 111 on which surface a catalyst is formed. The "place facing" means a place in which an injection axis line of each of the injection holes 12a forms an angle of not less than 0° and less than 90°, preferably of not less than 0° and not more than 60°, more preferably of not less than 0° and not more than 30° with a line normal to the base substrate 111. That is, the flow direction of gas as injected from the injection holes 12a of the injection section 12 is substantially orthogonal to the base substrate 111. The injection section 12 thus configured makes it possible to spray the raw material gas uniformly onto a base substrate and therefore efficiently consume the raw material gas. This makes it possible, as a result, to enhance the uniformity of an aligned CNT aggregate that grows on the base substrate 111 and lower the consumption of the raw material gas.

The injection holes 12a can have any shape such as a circular shape, a triangular shape, a quadrangular shape, a hexagonal shape, an elliptical shape, or a cross shape. However, in terms of easiness of processing, it is preferable that the injection holes 12a have a circular shape. It is more preferable that the circular shape have a diameter of not shorter than 0.1 mm and not longer than 10 mm. Further, in a case where a base substrate which is 500 mm square is used as the base substrate of the present invention, it is preferable that not less than 3 and not more than 300 injection holes 12a be provided for each injection hole row. Further, it is preferable that not less than 3 and not more than 300 injection hole rows be provided at regular intervals.

[Exhaust Section 13]

The exhaust section 13 is provided between the injection section 12 and the exhaust vent 15. The exhaust section 13 is a member having a surface on which the exhaust vents 13a (second exhaust vents) are provided for exhausting, towards the exhaust vent 15, a raw material gas having contacted the base substrate 111.

The exhaust section 13 is provided so as to be closer to the exhaust vent 15 than the injection holes 12a. That is, all of the exhaust vents 13a are provided so as to be closer to the exhaust vent 15 than all of the injection holes 12a.

The second exhaust vents which are thus provided so as to be closer to the first exhaust vent than the injection holes remove a residual gas from a space between the base substrate and the injection holes before exhausting the residual gas from the entire growth unit. This prevents the residual gas from remaining in the space between the base substrate and the injection holes, so that a raw material gas and/or a catalyst activation material are/is supplied to the base substrate at a more uniform concentration(s). This can prevent a deterioration in quality of CNTs in a rim of the base substrate even in a case where a large area base substrate is used as the base substrate.

Without the exhaust section 13, the residual gas would remain and diffuse in the growth furnace 11. That is, the residual gas, which is obtained after a raw material and a catalyst activation material are used on a surface of the base substrate 111 and has a reduced concentration, remains and diffuses, so that the raw material and the catalyst activation material have respective less uniform concentrations in the growth furnace 11. However, in a case where the exhaust section 13 is provided in a space between the injection section 12 and the exhaust vent 15, it is possible to further reduce a region in which gas obtained after the raw material and the catalyst activation material were used on the surface of the base substrate 111 diffuses, and consequently to cause the raw material gas and the catalyst activation material to have respective more uniform concentrations in a space between the injection section 12 and the base substrate 111.

The exhaust section 13 has a plate-like structure having a surface facing the mounting surface 14 on which the base substrate 111 is placed. The surface is provided with the exhaust vents 13a. The exhaust section 13 having the surface forms a space between the base substrate 111 and the surface. It goes without saying that the space is smaller than the entire inner space of the growth furnace 11 in the case of the exhaust section 13 having no surface. This reduces a region in which the residual gas remains and diffuses. The residual gas is exhausted fast from the reduced region. This allows the raw material gas etc. to have a more uniform concentration(s) in the space between the base substrate 111 and the injection section 12.

In a case where a base substrate which is 500 mm square is used as the base substrate 111 and the growth furnace 11 has a height of 300 mm, it is more preferable that the exhaust section 13 be provided at a height of not less than 10 mm and not more than 200 mm above the mounting surface 14. The exhaust section 13 which has a higher height causes the raw material gas and the catalyst activation material to be exhausted from the space between the injection section 12 and the base substrate 111 more slowly. This causes the raw material gas and the catalyst activation material to remain in the space for a longer time and consequently causes the raw material gas and the catalyst activation material to be used in larger amounts, so that the raw material gas and the catalyst activation material are less lost. However, from the viewpoint of further uniformization of respective concentrations of the raw material gas and the catalyst activation material in the space, it is more preferable that the exhaust section 13 have a lower height. Therefore, the above-mentioned range is more suitable.

Further, at least one of exhaust vent rows in which the exhaust vents 13a are aligned is located between adjacent ones of the pipes constituting a comb-like pattern of the injection section 12. That is, an exhaust vent row is provided between adjacent injection hole rows. Such an arrangement causes the injection holes 12a and the exhaust vents 13a to be close to each other. This allows faster exhaust from the exhaust vents 13a of a residual gas obtained after a raw material gas injected from the injection holes 12a is supplied to the base substrate 111 and then reflected from the base substrate. Therefore, it is possible to more efficiently prevent the residual gas from remaining in the space between the base substrate 111 and the injection holes 12a, so that the raw material gas to be supplied to the base substrate 111 has a more uniform concentration. Further, in a case where a catalyst activation material is also supplied, the catalyst activation material also has a more uniform concentration. Note that the exhaust vents 13a do not need to be provided in a place between respective rows of the injection holes 12a. The exhaust vents 13a can be provided in a place other than the above-mentioned space. For example, the exhaust vents 13a can be provided on the entire surface facing the mounting surface 14.

The exhaust vents 13a can have any shape such as a circular shape, a triangular shape, a quadrangular shape, a hexagonal shape, an elliptical shape, or a cross shape. However, in terms of easiness of processing, it is preferable that the exhaust vents 13a have a circular shape. It is more preferable that the circular shape have a diameter of not shorter than 1 mm and not longer than 60 mm. It is preferable that the exhaust vents be provided so as to have an aperture ratio of not less than 1% and not more than 60% to the surface facing the mounting surface 14. Further, in a case where a base substrate which is 500 mm square is used as the base substrate of the present invention, it is preferable that not less than 2 and not more than 300 exhaust vents be provided for each exhaust vent row. Further, it is preferable that not less than 2 and not more than 300 exhaust vent rows be provided in a space between the respective injection hole rows at regular intervals.

(Flow of Raw Material Gas)

Next, the following description discusses, with reference to FIG. 2, how a raw material gas flows in the growth unit 10.

A raw material gas is injected from the injection holes 12a towards the base substrate 111 in a direction indicated by an arrow a. The raw material gas thus injected flows along a surface of the base substrate 111 in directions indicated by arrows b. In this case, if the raw material gas continues flowing along the directions indicated by the arrows b, the raw material gas having a reduced concentration contacts a catalyst in a rim of the base substrate 111. This causes a deterioration in quality of CNTs that grow in the rim of the base substrate 111.

However, according to the present embodiment, the flow of the residual gas in a space between the injection holes 12a and the base substrate 111 is prevented by, for example, sucking, from the exhaust vents 13a, the raw material gas which remains in the space. That is, the raw material gas supplied to the base substrate 111 flows in a direction indicated by an arrow c and moves in a direction indicated by an arrow d so as to be exhausted from the exhaust vents 13a.

This allows a composition and a flow velocity of the raw material gas to be more uniform on the entire surface of the base substrate 111, so that an aligned CNT aggregate with more uniform quality can be synthesized on the base substrate 111 which has a large area.

(Section to Add a Catalyst Activation Material)

As described earlier, it is more preferable that the growth step be carried out in the presence of a catalyst activation material in an atmosphere in which the CNT growth reaction is carried out. For this reason, the growth unit 10 includes a section to add a catalyst activation material (not illustrated). The section to add a catalyst activation material is a set of devices for either adding a catalyst activation material into a raw material gas, or adding a catalyst activation material directly to an environment surrounding the catalyst inside of the growth unit 10. Means for supplying the catalyst activation material is not particularly limited. Examples of the means include supplying the catalyst activation material through a bubbler, supplying the catalyst activation material by vaporizing a solution containing the catalyst activation material, supplying the catalyst activation material as it is in a gaseous state, and supplying the catalyst activation material by liquefying/vaporizing a solid catalyst activation material. It is possible to build a supply system using various apparatuses such as a vaporizer, a mixer, a stirrer, a diluter, a sprayer, a pump, and a compressor. Furthermore, it is possible to provide a tube for the supply of the catalyst activation material with a device for measuring the concentration of the catalyst activation material. Through feedback control using values outputted from the measuring device, stable supply of the catalyst activation material with a small number of changes over time can be ensured.

Also for an injection section for injecting the catalyst activation material, it is possible to use an injection section having a configuration similar to that of the injection section 12 for injecting the raw material gas. Use of such an injection section makes it possible to spray the catalyst activation material uniformly onto the base substrate 111, and therefore enhance the activity of the catalyst and extend the longevity of the catalyst. This allows aligned CNT aggregates to continue to grow over a long period of time. The catalyst activation material may be added to the raw material gas and injected, together with the raw material gas, from the injection section 12. A similar effect can also be obtained in this case.

Embodiment 2

Figure 3:
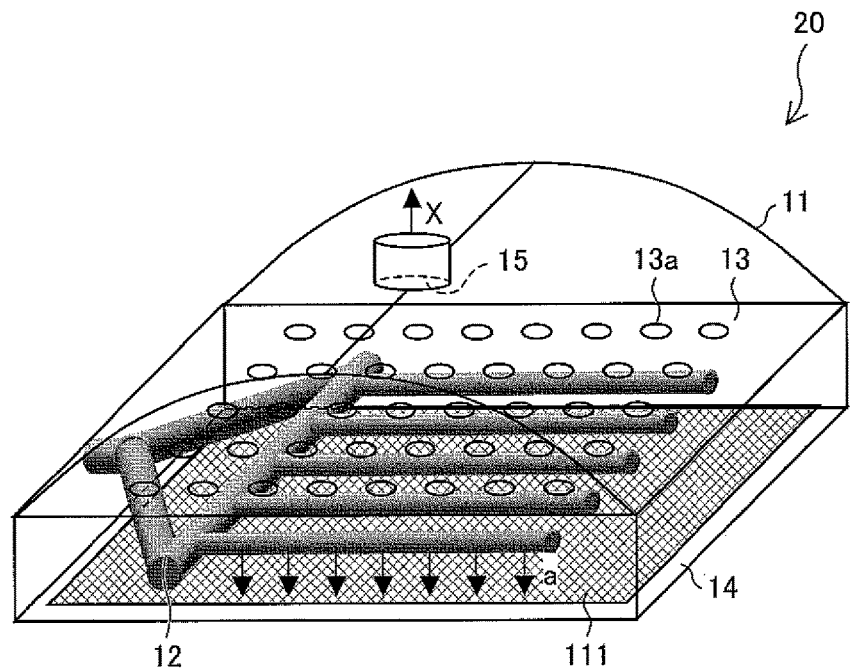
FIG. 3 is a view schematically showing a configuration of a growth unit of an aligned CNT aggregate production apparatus in accordance with Embodiment 2 of the present invention.
Figure 4:
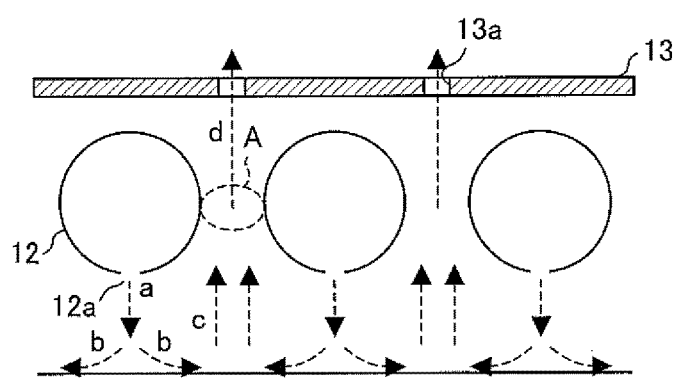
FIG. 4 is a view schematically showing how a raw material gas flows in the growth unit of Embodiment 2.

Next, a second embodiment of a growth unit included in a production apparatus of the present invention is described with reference to FIGS. 3 and 4. FIG. 3 is a view schematically showing a configuration of a growth unit 20 of an aligned CNT aggregate production apparatus in accordance with Embodiment 2. FIG. 4 is a view schematically showing how a raw material gas flows in the growth unit 20. Note that, for convenience of description, members having functions identical to those of the respective members illustrated in the drawings of Embodiment 1 are given respective identical reference numerals, and a description of those members is omitted here. Note also that the present embodiment mainly describes a point(s) of difference from Embodiment 1.

As shown in FIGS. 3 and 4, the growth unit 20 is made of a member of which the growth unit 10 is made. However, a difference in location of an exhaust section 13 of Embodiment 2 from the exhaust section 13 of Embodiment 1 forms a gap A. More specifically, since the growth unit 20 is arranged such that the exhaust section 13 is provided so as to be upper than pipes of an injection section 12, i.e., the exhaust section 13 is closer to an exhaust vent 15, the gap A is provided between the respective pipes each provided with an injection hole row.

As shown in FIG. 4, a residual gas obtained after a raw material gas injected from injection holes 12a is supplied to a base substrate 111 and then reflected from the base substrate 111 passes through the gap A fast and is removed from a space between the base substrate 111 and the injection holes 12a. That is, the gap A serves as a path through which the residual gas passes so as to be removed from the space. Therefore, it is possible to more efficiently prevent the residual gas from remaining in the space between the base substrate 111 and the injection holes 12a, so that the raw material gas to be supplied to the base substrate has a more uniform concentration. Further, in a case where a catalyst activation material is also supplied, the catalyst activation material also has a more uniform concentration.

Embodiment 3

Figure 5:
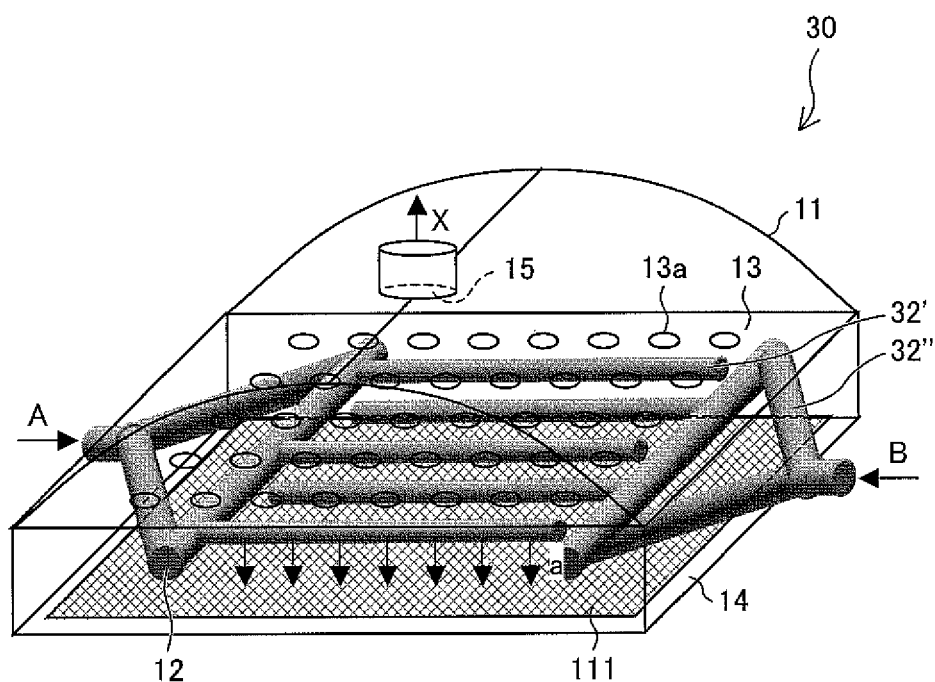
FIG. 5 is a view schematically showing a configuration of a growth unit of an aligned CNT aggregate production apparatus in accordance with Embodiment 3 of the present invention.

Next, a third embodiment of a growth unit included in a production apparatus of the present invention is described with reference to FIG. 5. FIG. 5 is a view schematically showing a configuration of a growth unit 30 in Embodiment 3. Note that, for convenience of description, members having functions identical to those of the respective members illustrated in the drawings of Embodiment 1 are given respective identical reference numerals, and a description of those members is omitted here. Note also that the present embodiment mainly describes a point(s) of difference from Embodiment 1.

The growth unit 30 is different from those of Embodiments 1 and 2 in that the growth unit 30 includes two injection sections, which are an injection section 32' and an injection section 32".

More specifically, the growth unit 30 includes the injection section 32' and the injection section 32". The injection section 32' and the injection section 32"" face each other so that a comb tooth of one of the injection sections is located between respective comb teeth of the other of the injection sections.

A raw material gas is supplied from respective opposite directions indicated by arrows A and B. The raw material gas is heated to have a higher temperature while passing through pipes. However, in a place where the raw material gas supplied from the direction indicated by the arrow A is high in temperature, the raw material gas supplied from the direction indicated by the arrow B is heated for a short time and thus remains low in temperature. Therefore, since the injection section 32' and the injection section 32" face each other so that a comb tooth of one of the injection sections is located between respective comb teeth of the other of the injection sections, it is possible to uniformize a temperature distribution in a width direction of a base substrate 111.

The present embodiment thus makes it possible to further prevent unevenness in temperature and heating history of a raw material gas and consequently to supply, to a base substrate, the raw material gas which is more uniform in temperature and heating history. Therefore, it is possible to produce CNTs with more uniform quality.

In terms of prevention of unevenness in temperature of a raw material gas, the growth unit 30 is more preferable than the growth unit 10 and the growth unit 20.

<Example of Production Apparatus of Present Invention>

Figure 6:
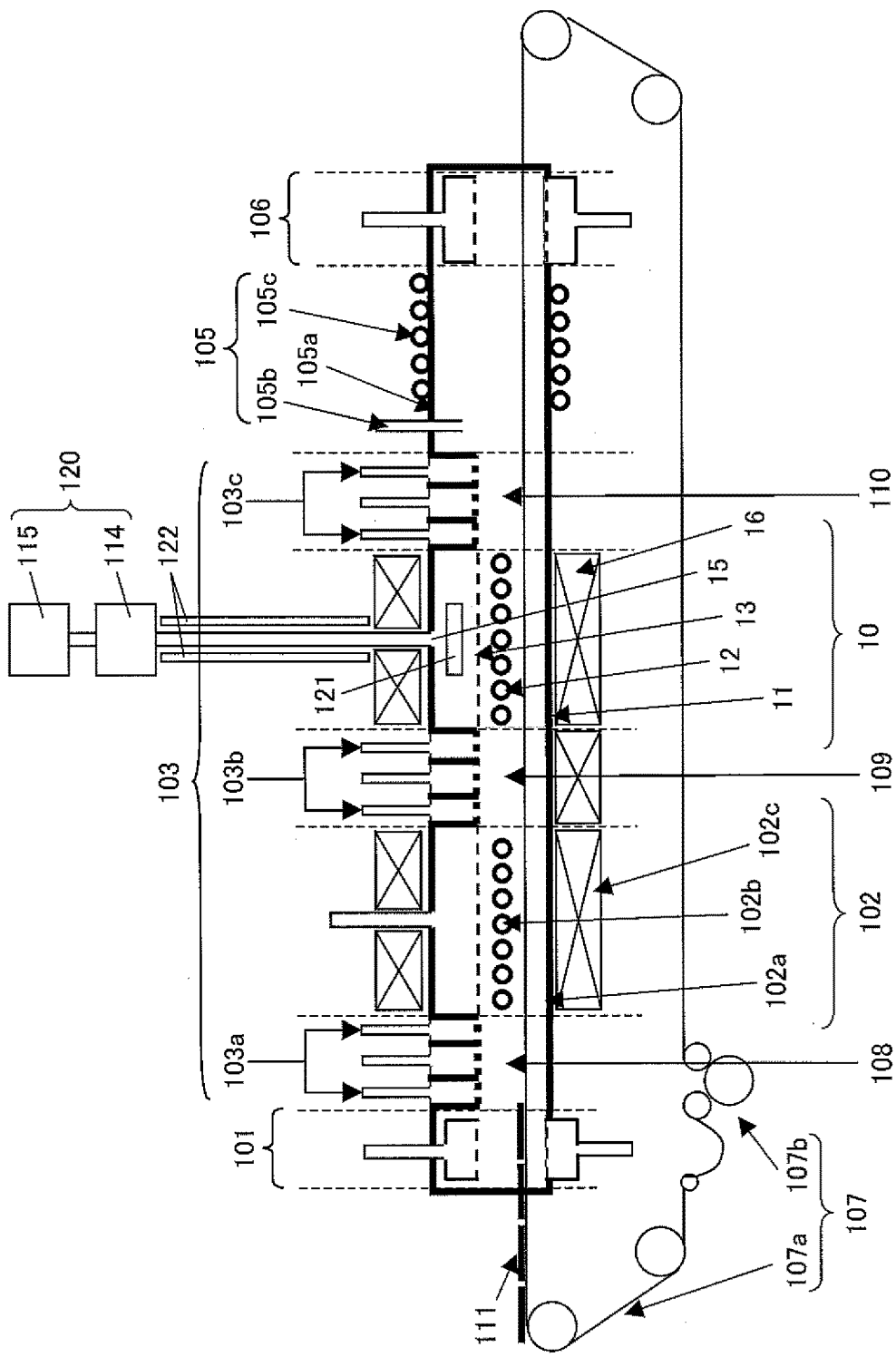
FIG. 6 is a view schematically showing a configuration of a CNT production apparatus which is an embodiment of an aligned CNT aggregate production apparatus in accordance with the present invention.
Figures 7, 8:
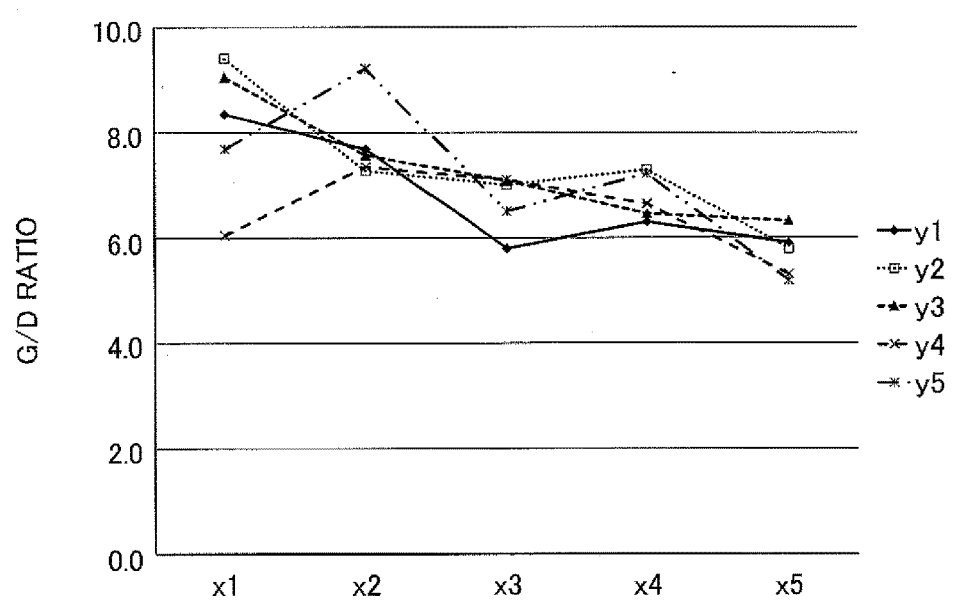
FIG. 7 is a view showing a distribution of G/D ratios of an aligned CNT aggregate of Example 1.
FIG. 8 is a graph showing the distribution of G/D ratios of the aligned CNT aggregate of Example 1.
Figures 9, 10:
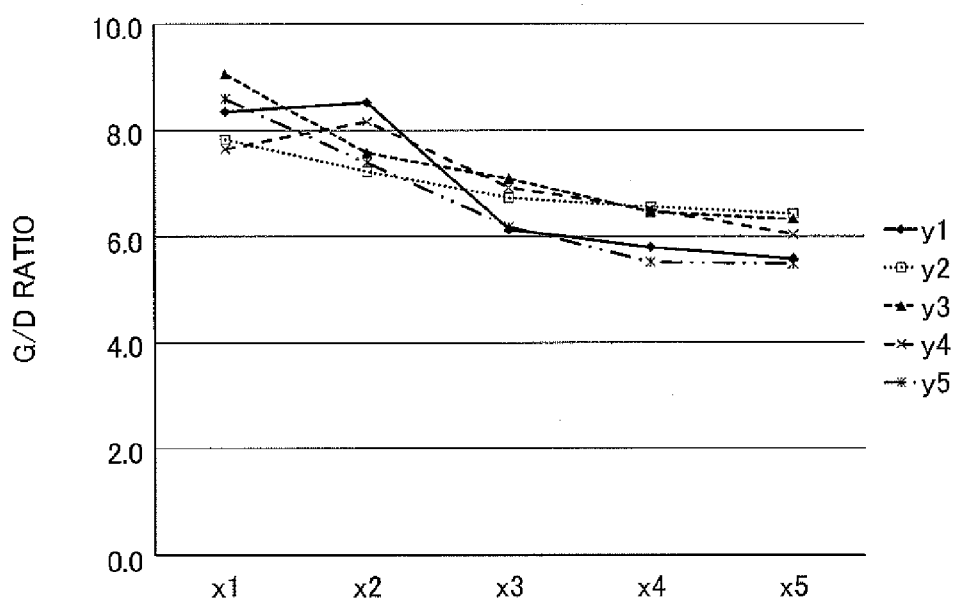
FIG. 9 is a view showing a distribution of G/D ratios of an aligned CNT aggregate of Example 2.
FIG. 10 is a graph showing the distribution of G/D ratios of the aligned CNT aggregate of Example 2.
Figures 11, 12:
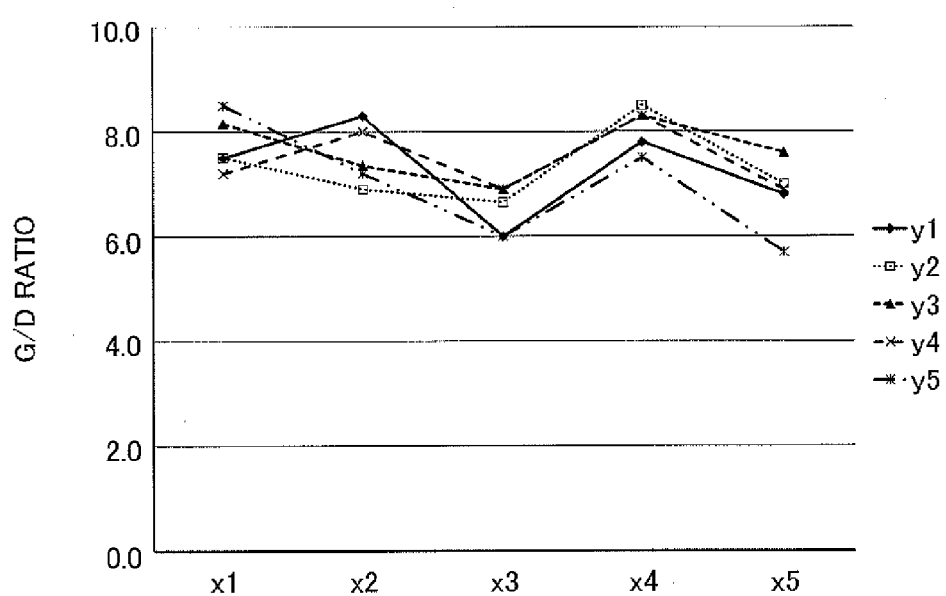
FIG. 11 is a view showing a distribution of G/D ratios of an aligned CNT aggregate of Example 3.
FIG. 12 is a graph showing the distribution of G/D ratios of the aligned CNT aggregate of Example 3.

Next, the following description discusses an example of a production apparatus of the present invention with reference to FIG. 6. FIG. 6 is a view showing a configuration of a CNT production apparatus 100, which is an embodiment of an aligned CNT aggregate apparatus in accordance with the present invention. This section discusses an example of a CNT production apparatus including the growth unit 10 described as the growth unit in Embodiment 1.

The CNT production apparatus 100 includes an inlet purge section 101, a formation unit 102, gas mixing prevention means 103, a growth unit 10, a cooling unit 105, an outlet purge section 106, a transfer unit (transfer means) 107, and connecting sections 108 through 110.

The formation unit 102, the growth unit 10, and the cooling unit 105 include a formation furnace 102a, a growth furnace 11, and a cooling furnace 105a, respectively. Respective furnace spaces of the formation furnace 102a, the growth furnace 11, and the cooling furnace 105a are spatially connected via the connecting sections 108 through 110.

[Inlet Purge Section 101]

The inlet purge section 101 is provided at an inlet of the production apparatus 100. The inlet purge section 101 is a set of devices for preventing the outside air from flowing into a furnace of the apparatus through an inlet for a base substrate 111. The inlet purge section 101 has such a function that an environment surrounding the base substrate 111 transferred into the apparatus is replaced by a purge gas.

The inlet purge section 101 has a gas curtain structure in which the purge gas is injected from up and down in the form of a shower. This prevents the outside air from flowing in the production apparatus 100 through the inlet of the apparatus. The inlet purge section 101 may be constituted by, for example, a furnace or a chamber in which the purge gas is retained and a gas injection section for injecting the purge gas.

It is preferable that the purge gas be an inert gas. In particular, in terms of safety, cost, and purging properties, it is preferable that the purge gas be nitrogen.

In a case where the inlet for the base substrate 111 is always open, e.g., in a case where the transfer unit 107 is of a belt-conveyor type as in the present embodiment, it is preferable that the inlet purge section 101 have the gas curtain structure as described above. This configuration makes it possible to prevent the outside air from flowing into the production apparatus 100 through the inlet for the base substrate 111.

[Formation Unit 102]

The formation unit 102 is a set of devices for realizing a formation step. The formation unit 102 has a function of causing an environment surrounding a catalyst formed on a surface of the base substrate 111 to be an environment of a reducing gas and heating at least either the catalyst or the reducing gas.

The formation unit 102 is constituted by the formation furnace 102a in which the reducing gas is retained, an injection section 102b for injecting the reducing gas into the formation furnace 102a, and a heater 102c for heating at least either the catalyst or the reducing gas.

It is possible to use, as the injection section 102b, a shower head including a plurality of injection holes. The injection section 102b having the configuration is provided in a place facing a surface of the base substrate 111 on which surface a catalyst is formed. The "place facing" means a place in which an injection axis line of each of the injection holes forms an angle of not less than 0 and less than 90° with a line normal to the base substrate 111. That is, the flow direction of gas as injected from the injection holes of the injection section 102b is substantially orthogonal to the base substrate 111.

Use of such a shower head as the injection section 102b makes it possible to spray the reducing gas uniformly onto the base substrate 111 and therefore efficiently reduce the catalyst. This makes it possible, as a result, to enhance the uniformity of an aligned CNT aggregate that grows on the base substrate 111 and lower the consumption of the reducing gas.

A heater used as the heater 102c is not limited provided that it is capable of heating, and examples of such a heater include a resistance heating heater, an infrared heating heater, and an electromagnetic induction heater. It is preferable that the heating temperature be in a range of 400° C. to 1,100° C.

(Reducing Gas)

In general, a reducing gas is a gas that has at least one of the effects of reducing a catalyst, stimulating the catalyst to become fine particles suitable for the growth of CNTs, and improving the activity of the catalyst, and that is in a gaseous state. Examples of the reducing gas include hydrogen gas, ammonium, water vapor, or a mixture thereof. Alternatively, it is possible to apply a mixed gas obtained by mixing such a gas with an inert gas such as helium gas, argon gas, or nitrogen gas. The reducing gas is generally used in a formation step, however, the reducing gas may be used in a growth step as appropriate.

(Formation Step)

The formation step is a step of causing an environment surrounding the catalyst supported on the base substrate 111 to be an environment of the reducing gas and heating the catalyst and/or the reducing gas. This step brings about at least one of the effects of reducing the catalyst, stimulating the catalyst to become fine particles suitable for the growth of CNTs, and improving the activity of the catalyst.

The catalyst and/or the reducing gas preferably have/has a temperature of not lower than 400° C. and not higher than 1,100° C. during the formation step. Further, the formation step is preferably carried out for a time being not shorter than 3 minutes and not longer than 30 minutes, and more preferably not shorter than 3 minutes and not longer than 8 minutes. In a case where the formation step is carried out for a time falling within the above range, fine catalyst particles are prevented from being rough. This can prevent generation of multiwall carbon nanotubes during the growth step.

For example, in a case where iron is used as the catalyst, a ferric hydroxide thin film or an iron oxide thin film is formed on the base substrate 111, the iron is reduced and micronized concurrently with or after the formation of the ferric hydroxide thin film or the iron oxide thin film, so that fine iron particles are formed. Further, in a case where the carburizing prevention layer provided on the base substrate 111 is made of alumina and a catalyst metal is iron, the iron catalyst layer is reduced to become fine particles, whereby a large number of fine iron particles in nanometer size are formed on the alumina layer. Thus, the catalyst is prepared to be a catalyst suitable to production of aligned CNT aggregates.

[Growth Unit 10]

The growth unit 10 of the present embodiment is identical to that described in Embodiment 1. Note that FIG. 6 illustrates a heater 16 included in the growth unit 10.

Here, the heater 16 is described. The heater 16 is not limited provided that it is capable of heating, and examples of such a heater include a resistance heating heater, an infrared heating heater, and an electromagnetic induction heater. It is preferable that the heating temperature be in a range of 400° C. to 1,100° C.

[Reaction Gas]

It is preferable that a reaction gas be used in the present invention. The reaction gas reduces a carbon solid that adheres to an inside of a pipe for leading, to an outside of the growth unit 10, gas having passed through an exhaust vent 15. The reaction gas has a function of changing a residual gas to a lower alkane, carbon monoxide, or carbon dioxide so as to prevent generation of a carbon solid that adheres to the inside of the pipe. The reaction gas preferably contains hydrogen atoms and/or oxygen atoms, whose specific examples include hydrogen, ammonia, oxygen, ozone, and water vapor. The reaction gas is preferably hydrogen or oxygen in terms of easiness of handling and greatness of a carbon solid generation prevention effect. In order to efficiently facilitate a chemical reaction of the residual gas and the reaction gas, it is possible to, for example, maintain a mixture of the residual gas and the reaction gas at a high temperature, cause the reaction gas to have a high concentration, and use a metal catalyst. In a case where the mixture of the residual gas and the reaction gas is maintained at a high temperature, such a temperature is preferably 400° C. or higher, and more preferably 600° C. or higher. It is only necessary that an amount of the reaction gas to be supplied to the residual gas be controlled so that the reaction gas has a concentration, as a volume fraction (calculated in a standard state) of, for example, not less than 5% and more preferably not less than 9% with respect to a total amount of gas to be exhausted. In a case where oxygen is used as the reaction gas, in order to avoid danger of explosion, it is necessary to supply oxygen in an amount which is not more than a critical oxygen concentration that is determined in accordance with a raw material carbon source to be used. In a case where a gas other than a gas containing oxygen atoms such as oxygen, ozone, or water is used as the reaction gas, it is more preferable that the reaction gas have a volume fraction lower than 100% with respect to the total amount of gas. Further, it is possible to use, as the metal catalyst, nickel, ruthenium, palladium, or platinum. The reaction gas may be diluted with an inert gas.

[Reaction Gas Injection Section 121]

The CNT production apparatus 100 includes a reaction gas injection section 121 for injecting the reaction gas described above. The reaction gas injection section 121 needs to be designed so that the reaction gas is exhausted without contacting a catalyst and a raw material gas which has not been used to synthesize CNTs but being mixed well with the raw material gas which has been used to synthesize the CNTs (i.e., residual gas). For example, as in the present embodiment, the reaction gas injection section 121 may be designed to inject the reaction gas directly to a space in which the residual gas exhausted from an exhaust section 13 is collected and through which the residual gas is sent to an exhaust vent 15, i.e., a space divided by a surface of the exhaust section 13. The reaction gas injection section 121 may include a plurality of reaction gas injection sections 121. In a case where a mixed gas in which the residual gas and the reaction gas are mixed has a higher temperature, a chemical reaction of the residual gas and the reaction gas further progresses. This makes it possible to prevent generation of a carbon solid. Therefore, the reaction gas may be heated in advance so as to have a high temperature.

[Exhaust Flow Volume Stabilization Section 120]

An exhaust flow volume stabilization section 120 is a device which is provided to the pipe for leading, to the outside of the growth unit 10, gas having passed through the exhaust vent 15 and which is capable of stabilizing, over time, a flow volume of exhaust from the pipe even though a carbon solid adheres to the pipe due to a long-time production. The exhaust flow volume stabilization section 120 includes at least (i) exhaust flow volume adjusting means 114 for adjusting an exhaust flow volume in an exhaust pipe, and (ii) exhaust flow volume measuring means 115 for measuring a flow volume of exhaust from the pipe. The exhaust flow volume stabilization section 120 may further include means such as carbon solid adhesion prevention means 122 for preventing a carbon solid from adhering to the pipe.

The exhaust flow volume stabilization section 120 controls an exhaust flow volume by the exhaust flow volume adjusting means 114 so that a value of the exhaust flow volume which value is measured by the exhaust flow measuring means 115 has an error falling within a range preferably of ±20%, and more preferably of ±10%, relative to a central value, which is a suitable exhaust flow volume preset for the pipe. This range is herein referred to as a "control range". More specifically, first, the exhaust flow volume measuring means 115 calculates or measures, from, for example, a measured pressure difference and a measured exhaust temperature, an exhaust flow volume by, for example, carrying out a calculation process in accordance with a conversion formula. Then, in a case where the exhaust flow volume exceeds an upper limit of a preset control range, exhaust flow volume controlling means (not illustrated) included in the exhaust flow volume adjusting means 114 lowers the exhaust flow volume by, for example, lowering a suction force of the exhaust flow volume adjusting means 114. In contrast, in a case where the exhaust flow volume falls below a lower limit of the control range, the exhaust flow volume controlling means carries out feedback control so as to increase the exhaust flow volume by, for example, increasing the suction force of the exhaust flow volume adjusting means 114. Note that the feedback control may be carried out automatically or manually. This makes it possible to stably control a flow volume of exhaust from an exhaust vent.

[Exhaust Flow Volume Measuring Means 115]

The exhaust flow volume measuring means 115 is a device which is provided to the pipe for leading, to the outside of the growth unit 10, gas having passed through the exhaust vent 15 and which is configured to measure an exhaust flow volume of gas to be exhausted after passing through the exhaust vent 15. For example, the exhaust flow volume measuring means 115 may have a function of measuring an exhaust flow volume by measuring a pressure difference between at least two points in the pipe which are apart from each other. It is more preferable that the exhaust flow volume measuring means 115 have a function of measuring a gas temperature in the pipe. Specific examples of the exhaust flow volume measuring means 115 include a differential pressure gauge for measuring a pressure difference and a thermocouple for measuring a gas temperature. A pressure difference which can be measured with high accuracy by use of a commercially-available differential pressure gauge is, for example, 0.1 Pa or greater, and more preferably 1 Pa or greater. Therefore, it is preferable that two measurement points be sufficiently distant from each other or a pressure loss section for causing a measurable pressure loss be provided in a measurement zone between the measurement points so that a pressure difference caused in the measurement zone is, for example, 0.1 Pa or greater, and more preferably 1 Pa or greater. Further, in order to improve flow volume measurement accuracy, it is possible to increase the number of pressure measurement points to 3 or more. It may be impossible to accurately measure a pressure difference if the pressure measurement points are too close in distance to each other. Hence, it is preferable that the pressure difference be measured with an interval of 0.5 D or more between the pressure measurement points assuming that D is an internal diameter of an exhaust vent.

The pressure loss section may be any pressure loss member provided that the member can be provided in the pipe and can reduce a cross sectional area of the pipe. Examples of such a pressure loss member include an orifice plate, a Venturi tube, a nozzle, and a perforated panel. Commercially-available pressure loss members are standards (JIS Z 8762-1 through 4), and their shapes and measuring methods etc. are therefore standardized. In a case where a pressure loss section in conformity with a standard is used, a flow volume is calculated by using a calculation formula stipulated in the standard. Note, however, that the calculation formula is only applicable to a condition that the pipe has an internal diameter of 50 mm or more and a Reynolds number of 5,000 or more. A minimum required flow volume estimated by the Reynolds number is approximately several hundred sLm. Therefore, the flow volume needs to be measured under conditions of an exhaust vent having a large diameter and a large exhaust volume.

It is preferable that the exhaust flow volume measuring means 115 use a thermal fluid simulation. This is because the thermal fluid simulation makes it possible to measure an exhaust flow volume with high accuracy even under pipe diameter and flow volume conditions which are beyond the scope of application in a conventional method. For example, in a case where the pressure loss section is an orifice plate, a relationship between a pressure difference to be lost ΔP and a flow volume F is represented by the following equation (2):

[Math. 1]

$$F_{[sLm]} = \sqrt{\frac{\Delta P_{[Pa]}}{\alpha}} \tag{2}$$

where α is a function of a temperature, a density, and a viscosity of an exhaust gas. In a case where α is found based on a result of the thermal fluid simulation, it is possible to convert a pressure difference into an exhaust flow volume with high accuracy. In a case where the thermal fluid simulation is used, the pressure loss section may have any shape and a range of a measurable flow volume is not limited.

[Exhaust Flow Volume Adjusting Means 114]

The exhaust flow volume adjusting means 114 is a device which is provided to the pipe for leading, to the outside of the growth unit 10, gas having passed through the exhaust vent 15 which is configured to adjust a flow volume of gas to be exhausted from the pipe. The exhaust flow volume adjusting means 114 has a function of adjusting a flow volume of gas to be exhausted. Further, the exhaust flow volume adjusting means 114 is capable of changing an exhaust flow volume in the exhaust vent 15 in accordance with a result measured by the exhaust flow volume measuring means 115. Specific examples of the exhaust flow volume adjusting means 114 include: gas suction devices for sucking gas such as a blower, a pump, and an ejector; and flow adjusting valves such as a ball valve, a syringe valve, and a gate valve. In a case where the exhaust flow volume adjusting means 114 is means employing a method in which an ejector whose driving fluid is gas is used to control a suction force of the ejector by causing a mass flow controller to control a flow volume of the driving fluid, it is possible to prevent a change in exhaust flow volume. Therefore, such means is more preferable to produce an aligned CNT aggregate. Note that the gas is preferably air or nitrogen.

[Carbon Solid Adhesion Prevention Means 122]

The carbon solid adhesion prevention means is configured to prevent a carbon solid from adhering to a pipe by heating to and/or keeping at a high temperature a residual gas flowing in the pipe, the pipe leading, to an outside of the growth unit, gas having passed through a first exhaust vent. According to the present embodiment, the carbon solid adhesion prevention means 122 is a device for heating to and/or keeping at a high temperature an inside of a portion of a pipe, which portion corresponds to a zone in which a pressure difference is measured by the exhaust flow volume measuring means 115, so as to prevent a carbon solid from adhering to the portion of the pipe, the pipe leading, to an outside of the growth unit 10, gas having passed through the exhaust vent 15. The exhaust flow volume stabilization section 120 including the carbon solid adhesion prevention means 122 reduces a carbon solid that adheres to the pipe in the portion. Therefore, it is possible to measure an accurate exhaust flow volume over a long time. This allows continuous production of aligned CNT aggregates to be stably maintained over a longer time.

Examples of the carbon solid adhesion prevention means 122 include a heater for heating the pipe and a heat insulating material for keeping the pipe warm. A higher temperature of an exhaust gas further reduces an amount of a carbon solid that adheres to the pipe. It is preferable the carbon solid adhesion prevention means 122 heat and/or keep warm an exhaust gas to and/or at a temperature of, for example, 150° C. or higher, and more preferably of 300° C. or higher. Further, it is preferable that the carbon solid adhesion prevention means 122 retain a temperature of the exhaust gas at 700° C. or lower. In a case where the temperature of the exhaust gas is retained at 700° C. or lower, it is possible to prevent problems (i) such that the pipe which is carburized declines in strength and (ii) the pipe needs to be all-welded due to difficulty in use of a gas sealing method for a high-temperature gas.

[Cooling Unit 105]

The cooling unit 105 is a set of devices for carrying out a cooling step, i.e., for cooling down the base substrate 111 on which an aligned CNT aggregate has grown. The cooling unit 105 has a function of cooling down the aligned CNT aggregate and the base substrate 111 after the growth step.

The cooling unit 105 has a configuration in which a water-cooled type and an air-cooled type are combined, and is constituted by the cooling furnace 105a in which an inert gas is retained, a coolant gas injection section 105b that injects the inert gas into the cooling furnace 105a, and a water-cooled cooling tube 105c disposed to surround an internal space of the cooling furnace 105a. Note that the cooling unit may be configured to be of only the water-cooled type or the air-cooled type.

Cooling by the cooling unit 105 makes it possible to prevent oxidization of the aligned CNT aggregate, a catalyst, and the base substrate 111 after the growth step.

(Cooling Step)

A cooling step is a step of, after the growth step, cooling down the aligned CNT aggregate, the catalyst, and the base substrate in an inert gas. After the growth step, the aligned CNT aggregate, the catalyst, and the base substrate are high in temperature, and therefore may be oxidized when placed in the presence of oxygen. This is prevented, during the cooling step, by cooling down the aligned CNT aggregate, the catalyst, and the base substrate in the presence of the inert gas. The temperature during the cooling step is 400° C. or lower, more preferably 200° C. or lower.

[Transfer Unit 107]

The transfer unit 107 is a set of devices necessary for continuously transferring a plurality of base substrates 111 to the CNT production apparatus 100. The transfer unit 107 includes a mesh belt 107a and a belt driving section 107b. The transfer unit 107 transfers a base substrate 111 to each of furnace spaces in an order of the formation unit 102, the growth unit 10, and the cooling unit 105.

The transfer unit 107 is of a belt-conveyor type in which the base substrate 111 having a catalyst formed on a surface thereof is transferred out of the formation furnace 102a into the cooling furnace 105a through the growth furnace 11. The transfer unit 107 transfers the base substrate 111 by the mesh belt 107a driven by the belt driving section 107b, for example, with use of a reducer-equipped electric motor. Moreover, the formation furnace 102a and the growth furnace 11, and the growth furnace 11 and the cooling furnace 105a have their respective internal spaces spatially connected via the connection sections 109 and 110, respectively. This enables the mesh belt 107a, on which the base substrate has been placed, to pass through the spaces between the respective furnaces.

Note that, in a case where the production apparatus of the present invention produces an aligned CNT aggregate continuously and includes the transfer unit, a specific configuration of the transfer unit is not limited to the above configuration. Examples of the transfer unit include a robot arm and a robot arm driving device in the case of a multi-chamber type.

[Connecting Sections 108 Through 110]

The connecting sections 108 through 110 are a set of devices via which the respective furnace spaces of the units are spatially connected and which serve to prevent the base substrate 111 from being exposed to the outside air while the base substrate 111 is transferred from one unit to another unit. Examples of the connecting sections 108 through 110 include a furnace or chamber capable of shielding an environment surrounding the base substrate 111 from the outside air and passing the base substrate 111 from one unit to another unit.

The inlet purge section 101 and the formation unit 102 are spatially connected via the connecting section 108. The connecting section 108 is provided with an exhaust section 103a of the gas mixing prevention means 103, and through the exhaust section 103a, a mixture of a purge gas injected from the inlet purge section 101 and a reducing gas injected from the injection section 102b is exhausted. This prevents the purge gas from flowing into the formation furnace 102a and the reducing gas from flowing in toward the inlet purge section 101.

The formation unit 102 and the growth unit 10 are spatially connected via the connecting section 109. The connecting section 109 is provided with an exhaust section 103b of the gas mixing prevention means 103, and through the exhaust section 103b, a reducing gas inside of the formation furnace 102a and a raw material gas and a catalyst activation material inside of the growth furnace 11 are exhausted. This prevents the raw material gas or the catalyst activation material from flowing into the formation furnace 102a and the reducing gas from flowing into the growth furnace 11.

The growth unit 10 and the cooling unit 105 are spatially connected via the connecting section 110. The connecting section 110 is provided with an exhaust section 103c of the gas mixing prevention means 103, and through the exhaust section 103c, a mixture of (i) a raw material gas and a catalyst activation material inside of the growth furnace 11 and (ii) an inert gas inside of the cooling furnace 105a is exhausted. This prevents the raw material gas or the catalyst activation material from flowing into the cooling furnace 105a and the inert gas from flowing into the growth furnace 11.

Note that the production apparatus of the present invention may further include heating means for heating the connecting section 110 between the growth unit 10 and the cooling unit 105. Note here that a decline in temperature in a place near an outlet of the growth furnace 11 may cause a decomposition product from a raw material gas to be amorphous carbon and then to accumulate at a tip of a CNT. This may cause a CNT which grows in a vertical direction from a base substrate to have a tip-G/D ratio remarkably smaller than a root-G/D ratio.

However, in a case where the connecting section 110 between the growth unit 10 and the cooling unit 105 is heated, a difference between the tip-G/D ratio and the root-G/D ratio can be made smaller. Therefore, it is possible to obtain an aligned CNT aggregate with a stable quality.

Specific examples of the heating means may include heating means for heating a seal gas to be used in gas mixing prevention means (described later) which is included in the gas mixing prevention means 103 and located between the growth unit 10 and the cooling unit 105. It is possible to heat the outlet of the growth furnace 11 and the place near the outlet by heating the seal gas.

[Gas Mixing Prevention Means 103]

The gas mixing prevention means 103 is a set of devices for carrying out a function of preventing gas from flowing out of a furnace space of one of the units into that of another. The gas mixing prevention means 103 is provided in the connecting sections 108 through 110 via which respective furnace spaces of the units are spatially connected. The gas mixing prevention means 103 includes the exhaust sections 103a through 103c for exhausting, out of the system, gasses in the connection sections 108 through 110 and/or respective places near the connection sections 108 through 110.

Note that a configuration of the gas mixing prevention means 103 is not limited to that of the present embodiment. However, the gas mixing prevention means 103 may be, for example, a gate valve device that mechanically disconnects the spatial connection between one unit and another during a period of time except when the base substrate 111 moves from one unit to another. Further, the gas mixing prevention means 103 may be a gas curtain device that breaks the spatial connection between one unit to another by injecting an inert gas.

In order to surely prevent gas mixing, it is preferable that the gate valve device and/or the gas curtain device be used in combination with an exhaust device. Further, from the viewpoint that CNTs are efficiently synthesized by continuously transferring a base substrate from one unit to another, and in view of simplification of a production apparatus, it is more preferable that the exhaust device be used alone.

Further, the gas mixing prevention means of the present invention may include (i) respective at least one seal gas injecting sections each of which injects a seal gas along aperture planes of the inlets and the outlets of the base substrate in the respective furnaces and (ii) respective at least one exhaust sections each of which exhausts the seal gas thus injected and other neighboring gases to an outside of the production apparatus mainly by sucking the seal gas so as to prevent the seal gas from entering the respective furnaces. In a case where the seal gas is injected along the aperture planes of the furnaces, it is possible to block the inlets and outlets of the furnaces. This prevents the gas outside the furnaces from flowing into the furnaces. Moreover, in a case where the seal gas is exhausted out of the production apparatus, it is possible to prevent the seal gas from flowing into the furnaces.

It is preferable that the seal gas be an inert gas. In particular, in terms of safety, cost, etc., it is preferable that the seal gas be nitrogen. The seal gas injection sections and the exhaust sections may be provided so that one of the exhaust sections is located near a corresponding one of the seal gas injection sections or so that the exhaust sections face, across the mesh belt, the seal gas injection sections, respectively. Note that it is preferable that the seal gas injection sections and the exhaust sections be provided so that an overall configuration of the gas mixing prevention means 103 is symmetrically located along a furnace length direction.

For example, it is preferable that two seal gas injection sections be provided at respective both sides of one exhaust section so that the overall configuration of the gas mixing prevention means has a structure symmetrically located along the furnace length direction about a center of the one exhaust section. Further, it is preferable that a total flow of gas injected from the seal gas injection sections and a total flow of gas exhausted from the exhaust sections be substantially equal in amount. This makes it possible to (i) prevent gases which flow from spaces on both sides of the respective gas mixing prevention means from mixing with each other and (ii) prevent the seal gas from flowing into the spaces. In a case where the gas mixing prevention means are provided on both sides of the growth furnace, it is possible to prevent a flow of the seal gas and a flow of a gas in the growth furnace from interfering with each other. Furthermore, turbulence in the flow of the gas due to the flow of the seal gas into the growth furnace can be also prevented. Accordingly, it is possible to provide the production apparatus which is suitable for successively producing the aligned CNT aggregates.

Further, it is preferable that the gas mixing prevention means 103 function so that the concentration of carbon atoms in an environment of the reducing gas in the formation furnace is kept smaller than or equal to $5 \times 10^{22}$ atoms/m$^3$, or more preferably smaller than or equal to $1 \times 10^{22}$ atoms/m$^3$.

Respective exhaust quantities Q of a plurality of exhaust sections, i.e., the exhaust sections 103a through 103c cannot be each independently determined, and need to be adjusted according to the amount of gas supplied to the whole apparatus such as the flow volume of the reducing gas, the flow volume of the raw material gas, and the flow volume of a coolant gas. However, a necessary condition for gas mixing prevention to be satisfied can be represented by the following equation.

$$Q \geq 4DS/L$$

where D is the diffusion coefficient of a gas that needs to be prevented from flowing in, S is the sectional area of a boundary at which the gas is prevented from flowing in, and L is the length of each exhaust section (along the length of the furnace). The exhaust quantity of each of the exhaust sections 103a through 103c is set so that the conditional equation is satisfied and a balance between gas supply and gas exhaust in the whole apparatus is kept.

(Concentration of Carbon Atoms)

Inflow of a raw material gas into the formation furnace 102a exerts a harmful influence on the growth of CNTs. It is preferable that the inflow of the raw material gas into the formation furnace 102a be prevented by the gas mixing prevention means 103 so that the concentration of carbon atoms in the environment of the reducing gas in the formation furnace 102a is kept smaller than or equal to $5 \times 10^{22}$ atoms/m$^3$, or more preferably smaller than or equal to $1\times10^{22}$ atoms/m$^3$. The "concentration of carbon atoms" here is calculated according to the following equation (1):

[Math. 2]

$$\text{(Concentration of Carbon Atoms)} = \sum_i C_i \frac{\rho_i D_i}{M_i} N_A \quad (1)$$

where with respect to the types of gas contained in the environment of the reducing gas (i=1, 2, . . . ), the concentration (ppmv) is denoted by $D_1, D_2, \ldots$, the density in standard condition (g/m$^3$) is denoted by $\rho_1, \rho_2, \ldots$, the molecular weight is denoted by $M_1, M_2, \ldots$, and the number of carbon atoms contained in each gas molecule is denoted by $C_1, C_2, \ldots$, and the Avogadro's number is denoted by NA.

The production volume and quality of CNTs can be satisfactorily maintained by keeping the concentration of carbon atoms in the environment of the reducing gas in the formation furnace 102a at not greater than $5\times10^{22}$ atoms/m$^3$. That is, the concentration of carbon atoms of $5\times10^{22}$ atoms/m$^3$ or smaller makes it possible, in the formation step, to satisfactorily exhibit the effects of reducing the catalyst, stimulating the catalyst to become fine particles suitable for the growth of CNTs, and improving the activity of the catalyst, whereby the production volume and quality of CNTs during the growth step can be satisfactorily maintained.

[Outlet Purge Section 106]

The production apparatus 100 has an outlet provided with the outlet purge section 106 which is substantially identical in configuration to the inlet purge section 101. The outlet purge section 106 is a set of devices for preventing the outside air from flowing into the inside of the production apparatus 100 through the outlet for the base substrate 111. The outlet purge section 106 has a function of causing the environment surrounding the base substrate 111 to be an environment of a purge gas.

The outlet purge section 106 injects a purge gas from up and down in the form of a shower and thereby prevents the outside air from flowing into the cooling furnace 105a through the outlet. Note that the outlet purge section 106 may be constituted by a furnace or a chamber for maintaining the environment of the purge gas and/or injection sections for injecting the purge gas etc.

It is preferable that the purge gas be an inert gas. In particular, in terms of safety, cost, and purging properties, it is preferable that the purge gas be nitrogen.

In a case where the outlet for the base substrate 111 is always open, e.g., in a case where the transfer unit 107 is of a belt-conveyor type as in the present embodiment, it is preferable that the outlet purge section 106 have a structure such as the gas curtain structure as described above. This configuration makes it possible to prevent the outside air from flowing into the production apparatus 100 through the outlet for the base substrate 111.

(Materials for Those Components of the Apparatus which are Exposed to Either the Reducing Gas or the Raw Material Gas)

Examples of those components of the apparatus which are exposed to either the reducing gas or the raw material gas are the formation unit 102, the growth unit 10, the transfer unit 107, the gas mixing prevention means 103, and some components of the connecting sections 108 through 110. Specific examples include such components of the apparatus as the formation furnace 102a, the injection section 102b for injecting a reducing gas, the growth furnace 11, the injection section 12 for injecting a raw material gas, the mesh belt 107a, the exhaust sections 103a through 103c of the gas mixing prevention means 103, and the furnaces of the connecting sections 108 through 110.

Examples of materials for those components of the apparatus which are exposed to either the reducing gas or the raw material gas include materials capable of resisting high temperatures, such as quartz, heat-resistant ceramic, and metals. The metals are preferable in terms of precision of processing, degree of freedom of processing, and cost. Examples of the metals include heat-resistant alloys. Examples of the heat-resistance alloys include heat-resistant steel, stainless steel, and nickel-based alloys. In general, heat-resistant steel refers to steel that contains Fe in major proportions and other alloys in concentrations of not more than 50%. Moreover, stainless steel refers to steel that contains Fe in major proportions, other alloys in concentrations of not more than 50%, and approximately not less than 12% of Cr. Further, examples of the nickel-based alloys include alloys obtained by adding Mo, Cr, Fe, and the like to Ni. Specifically, SUS 310, Inconel 600, Inconel 601, Inconel 625, Incoloy 800, MC Alloy, Haynes 230 Alloy are preferable in terms of heat resistance, mechanical strength, chemical stability, and low cost.

In a case where the inner walls of the furnaces and/or components for use in the furnaces are made of a metal, it is preferable that the metal be a heat-resistant alloy and that a surface of the metal be plated with molten aluminum or be polished so that the surface has an arithmetic average roughness Ra≤2 µm. This makes it possible to reduce carbon contaminants that adhere to the wall surfaces and the like when CNTs are synthesized in a high-carbon environment. This favorably makes it possible to prevent a decrease in production volume and deterioration in quality of aligned CNT aggregates.

(Molten Aluminum Plating)

Molten aluminum plating means a process of forming an aluminum or aluminum alloy layer on a surface of an object by dipping the object into a bath of molten aluminum. An example of the process is as follows: A preprocessing by washing a surface of a base metal (i.e., an object) and then dipping the object into a bath of molten aluminum at approximately 700° C., thereby causing the molten aluminum to disperse into the surface of the base metal, forming an alloy of the base metal and aluminum, and causing aluminum to adhere to the alloy layer when the base metal is withdrawn from the bath. Furthermore, after the process, a process of exposing a Fe—Al alloy layer under the alumina and aluminum surface layer by subjecting the surface layer to low-temperature thermal diffusion may be executed.

(Polishing)

Examples of a method for polishing the heat-resistant alloy so that the arithmetic average roughness is Ra≤2 µm include: mechanical polishing, which is typified by buffing; chemical polishing, which involves the use of a chemical; electrolytic polishing, which is carried out while passing an electric current through an electrolyte; and complex electrolytic polishing, which is a combination of mechanical polishing and electrolytic polishing.

(Arithmetic Average Roughness)

For a definition of arithmetic average roughness Ra, see "JIS B 0601: 2001".

As described above, in the production apparatus 100 according to the present embodiment, a series of the base substrates 111 each having a catalyst on a surface thereof is transferred by the transfer unit 107 to pass through the inlet purge section 101, the formation unit 102, the growth unit 10, the cooling unit 105, and the outlet purge section 106 in this order. In the meantime, the catalyst is reduced in an environment of the reducing gas in the formation unit 102, and CNTs grow on the surfaces of the base substrates in an environment of the raw material gas in the growth unit 10 and then is cooled down in the cooling unit 105.

The present invention is not limited to the description of the preferred embodiments above, but may be applied in many variations within the scope of gist thereof.

For example, through an appropriate setting of reaction conditions such as raw material gas and heating temperature, it is possible to selectively produce either single-walled or multiwall CNTs, and it is also possible to produce both single-walled and multiwall CNTs.

Further, according to the present embodiment, the catalyst is formed onto the surface of the base substrate by a film-forming apparatus provided separately from the production apparatus. However, the production apparatus may be configured such that a catalyst film-forming unit is provided upstream of the formation unit 102 so that the base substrate passes through the catalyst film-forming apparatus before it passes through the formation unit 102.

Further, according to the present embodiment, the formation unit 102, the growth unit 10, and the cooling unit 105 are arranged in this order and have their respective furnace spaces spatially connected via the connecting sections 108 through 110. However, a plurality of units that process steps other than the formation step, the growth step, and the cooling step may be further provided somewhere and have their respective furnace spaces spatially connected via the connecting sections 108 through 110.

Further, the present embodiment has discussed a case where the formation unit 102, the growth unit 10, and the cooling unit 105 are linearly provided. However, how to provide these units is not limited to this. The units may be circularly provided.

The above description has mainly discussed, as a suitable embodiment for continuously producing CNTs, an embodiment in which the formation unit and the growth unit are separately provided so that the base substrate is continuously transferred to each of these units. However, an embodiment of a production apparatus of the present invention is not limited to such an embodiment. For example, the production apparatus may be a batch type production apparatus in which a formation step and a growth step are carried out in a single furnace. In this case, for example, supply of a reducing gas required for the formation step can be carried out by, for example, an injection section of a growth unit included in the production apparatus of the present invention. This brings about an advantage of forming a catalyst layer more uniformly on the base substrate.

<Method for Producing Aligned Carbon Nanotube Aggregate>

A method of the present invention for producing an aligned carbon nanotube aggregate is a method for producing an aligned carbon nanotube aggregate by synthesizing the aligned carbon nanotube aggregate on a base substrate that supports a catalyst on a surface thereof, the method including: a growth step of synthesizing the aligned carbon nanotube aggregate on the base substrate by supplying a raw material gas for carbon nanotubes to the catalyst and heating at least either the catalyst or the raw material gas, the growth step being carried out by a growth unit, the growth unit including: at least one injection section including at least one injection hole from which the raw material gas is injected to the base substrate; a first exhaust vent being on one side, relative to the at least one injection section, while a mounting surface on which the base substrate is placed is on the other side relative to the injection section, for exhausting, out of a growth furnace, the raw material gas that was injected from the at least one injection hole and then contacted the base substrate, the growth furnace storing the base substrate while the aligned carbon nanotube aggregate is being synthesized; and an exhaust section including a plurality of second exhaust vents that exhausts, towards the first exhaust vent, the raw material gas that contacted the base substrate, the plurality of second exhaust vents being provided so as to be closer to the first exhaust vent than a plurality of injection holes included in the at least one injection hole of the at least one injection section.

Descriptions of the growth step, the growth unit, the injection section, and the exhaust section are based on those given earlier of the apparatus for producing an aligned carbon nanotube aggregate in accordance with the present invention.

The present invention is not limited to the descriptions of the respective embodiments, but may be altered within the scope of the claims. An embodiment derived from a proper combination of technical means disclosed in different embodiments is encompassed in the technical scope of the invention.

As described above, the apparatus of the present invention for producing an aligned carbon nanotube aggregate is more preferably configured such that the exhaust section has a surface which faces the mounting surface and on which the plurality of second exhaust vents are provided.

A space is formed between the base substrate and the surface. It goes without saying that the space is smaller than the entire inner space of a furnace in the case of the exhaust section having no surface. This reduces a region in which a raw material gas diffuses after being used. Further, in a case where a catalyst activation material is also supplied, a region is reduced in which the catalyst activation material diffuses after being used. The raw material gas that has been used is exhausted fast from the reduced region. This allows the raw material gas and/or the like that have/has been used to have a more uniform concentration(s) in the space between the base substrate and the injection section.

The apparatus of the present invention for producing an aligned carbon nanotube aggregate is more preferably configured such that the at least one injection section has at least one injection hole row in which the plurality of injection holes are aligned.

This configuration allows the raw material gas to be injected to the base substrate more uniformly.

The apparatus of the present invention for producing an aligned carbon nanotube aggregate is more preferably configured such that the at least one injection hole row includes a plurality of injection hole rows between adjacent ones of which a gap is formed.

A residual gas obtained after the raw material gas injected from the injection holes is supplied to the base substrate and then reflected from the base substrate passes through the gap fast and is removed from a space between the base substrate and the injection holes. Therefore, it is possible to more efficiently prevent the residual gas from remaining in the space between the base substrate and the injection holes, so that the raw material gas to be supplied to the base substrate has a more uniform concentration. Further, in a case where a catalyst activation material is also supplied, the catalyst activation material also has a more uniform concentration.

The apparatus of the present invention for producing an aligned carbon nanotube aggregate is more preferably configured such that at least one of exhaust vent rows in which the plurality of second exhaust vents are aligned is located between adjacent ones of the injection hole rows.

In a case where the injection holes and the second exhaust vents are close to each other, it is possible to exhaust faster, from the second exhaust vents, the residual gas obtained after the raw material gas injected from the injection holes is supplied to the base substrate and then reflected from the base substrate. Therefore, it is possible to more efficiently prevent the residual gas from remaining in the space between the base substrate and the injection holes, so that the raw material gas to be supplied to the base substrate has a more uniform concentration. Further, in a case where a catalyst activation material is also supplied, the catalyst activation material also has a more uniform concentration.

The apparatus of the present invention for producing an aligned carbon nanotube aggregate is more preferably configured such that the at least one injection section includes a plurality of injection hole rows included in the at least one injection hole row in which the plurality of injection holes are aligned, the plurality of injection hole rows constituting a comb-like pattern.

With this configuration, the raw material gas is supplied to the base substrate at a more uniform concentration. In a case where a catalyst activation material is also supplied to the base substrate, the catalyst activation material is also supplied to the base substrate at a more uniform concentration. Therefore, it is possible to produce CNTs with more uniform quality even in a case where a large area base substrate is used as the base substrate.

The apparatus of the present invention for producing an aligned carbon nanotube aggregate is more preferably configured such that the at least one injection section includes two injection sections which face each other so that a comb tooth of one of the two injection sections is located between respective comb teeth of the other of the two injection sections.

In a case where the raw material gas is supplied from the sections which face each other, it is possible to further prevent unevenness in temperature and heating history of the raw material gas and consequently to supply, to the base substrate, the raw material gas which is more uniform in temperature and heating history. Therefore, it is possible to produce CNTs with more uniform quality.

The method for producing an aligned carbon nanotube aggregate in accordance with the present invention is preferably arranged such that the supply of the raw material gas in the growth step includes supplying a catalyst activation material. This makes it possible to maintain the activity of the catalyst for a longer period of time.

EXAMPLES

The present invention is specifically described below with reference to Examples. However, the present invention is not limited to these Examples.

[Base Substrate]

As a base substrate, a flat plate was used which had 500 mm in width×500 mm in length, and 0.3 mm in thickness and was made of a Fe—Cr alloy SUS430 (manufactured by JFE Steel Corporation, containing 18% Cr). A surface roughness was measured at a plurality of points with use of a laser microscope and found to be an arithmetic average roughness Ra=0.063 μm.

[Catalyst Formation]

A catalyst was formed on the base substrate by the following method.

1.9 g of aluminum tri-sec-butoxide was dissolved in 10 mL (78 g) of 2-propanol, and then 0.9 g of triisopropanol amine was added as a stabilizer and dissolved in a resulting mixture, so that a coating agent for forming an alumina layer was prepared.

The base substrate was coated, by dip coating at a room temperature of 25° C. and a relative humidity of 50%, with the coating agent for forming an alumina layer (described above). The coating was carried out under the condition that the base substrate was dipped and then retained for 20 seconds, and was lifted at a speed of 10 mm/sec and then air-dried for 5 minutes.

Subsequently, the base substrate was heated under an atmospheric environment at a temperature of 300° C. for 30 minutes and then cooled down to a room temperature. An alumina layer having a film thickness of 40 nm was thus formed as a carburization prevention layer on the base substrate.

Next, 174 mg of iron acetate was dissolved in 100 mL of 2-propanol, and then 190 mg of triisopropanol amine was added as a stabilizer and dissolved in a resulting mixture, so that an iron layer coating agent was prepared. The base substrate having the alumina layer thereon was coated, by dip coating at a room temperature of 25° C. and a relative humidity of 50%, with the iron layer coating agent. The coating was carried out under the condition that the base substrate was dipped and then retained for 20 seconds, and was lifted at a speed of 3 mm/sec and then air-dried for 5 minutes. Subsequently, the base substrate was heated under an atmospheric environment at a temperature of 100° C. for 30 minutes. After the heating, the base substrate was cooled down to a room temperature, so that a catalyst layer having a film thickness of 3 nm was formed.

Example 1

An aligned CNT aggregate was produced by causing the production apparatus described in <Embodiment 1> to successively carry out a process including the formation step and the growth step.

An injection section included 20 injection hole rows which were provided at intervals of 200 mm and each of which (i) had a length of 500 mm and (ii) included 30 circular injection holes provided at regular intervals and having a diameter of 5 mm. A distance between the base substrate and the respective injection holes was set to 50 mm, and an angle formed by an injection axis line of each of the injection holes with a line normal to the base substrate was set to 0°.

An exhaust section included 20 exhaust vent rows which were provided at intervals of 200 mm and each of which (i) had a length of 500 mm and (ii) included 20 circular exhaust vents provided at regular intervals and having a diameter of 15 mm. A distance between the base substrate and the respective exhaust vents was set to 150 mm.

The base substrate having a catalyst thereon was placed on a mesh belt of the production apparatus. An aligned CNT aggregate was produced on the base substrate while a transfer speed of the mesh belt was being changed.

Conditions for each section of the production apparatus were set as shown in Table 1.

TABLE 1

| | GAS FLOW VOLUME [sLm] COMPOSITION | FURNACE TEMPERATURE [° C.] | PROCESSING TIME [MIN] | EXHAUST QUANTITY [sLm] |
|---|---|---|---|---|
| INLET PURGE SECTION 101 | 300<br>$N_2$: 100% | | | |
| EXHAUST SECTION 103a | 100<br>$N_2$: 100% | | | 100 |
| FORMATION UNIT 102 | 140<br>$H_2$: 60%<br>$N_2$: 40% | 820 | 28 | 140 |
| EXHAUST SECTION 103b | 125<br>$N_2$: 100% | | | 125 |
| GROWTH UNIT 10 | 150<br>$C_2H_4$: 10%<br>$H_2O$: 100 ppm<br>$CO_2$: 4%<br>$N_2$: remainder | 810 | 11 | 150 |
| EXHAUST SECTION 103c | 100<br>$N_2$: 100% | | | 100 |
| COOLING UNIT 105 | 50<br>$N_2$: 100% | 30 | 30 | |
| OUTLET PURGE SECTION 106 | 250<br>$N_2$: 100% | | | |

Respective amounts of gasses to be injected from the reducing gas injection section 102b and the raw material gas injection section 12 are set, in proportion to respective volumes of furnaces, to be suitable to produce an aligned CNT aggregate. Further, in order to securely prevent a gas in the formation furnace 102a from flowing into the growth unit 11 or a gas in the growth unit 11 from flowing into the formation furnace 102a, the exhaust section 103b was set to be the largest in seal gas amount and exhaust quantity of the three exhaust sections 103a, 103b, and 103c of the gas mixing prevention means 103.

Exhaust from the growth unit 10 was carried out while an exhaust flow volume was being adjusted with use of the exhaust flow volume stabilization section 120 including the exhaust flow volume adjusting means 114 and the exhaust flow volume measuring means 115. The exhaust flow volume measuring means 115 was constituted by (i) an exhaust pipe which has an inner diameter of 25 mm and includes two connecting pipes and one thermocouple insertion pipe, (ii) a pressure loss section made of a circular plate (orifice plate) which has a thickness of 0.3 mm and has, at its center, a hole having a diameter of 11 mm, (iii) a fine pressure difference meter (Pressure Transducer DP 103 manufactured by Validyne Engineering Corporation) connected to each of the connecting pipes, and (iv) a sheath type thermocouple.

The exhaust flow volume adjusting means 114 was constituted by an ejector, a driver gas cylinder, a massflow controller (exhaust flow volume controlling means) for controlling a flow volume of a driver gas. An exhaust sucking force of the ejector was adjusted by using nitrogen as the driver gas and causing the massflow controller to control the flow volume of the driver gas.

The exhaust flow volume stabilization section 120 was used to control an exhaust flow volume of each of the sections so that a change over time in exhaust flow volume of the each of the sections falls within a range of ±10% during production of an aligned CNT aggregate.

Further, in order to reduce a carbon solid that adheres to an inside of the exhaust pipe, 40 sLm of hydrogen was injected as a reaction gas from the reaction gas injection section 121 and then exhausted through the exhaust vent 15 while being mixed with an exhaust gas (residual gas) from the growth unit.

Example 2

An aligned CNT aggregate was produced by causing the production apparatus described in <Embodiment 2> to successively carry out a process including the formation step and the growth step.

An injection section included 20 injection hole rows which were provided at intervals of 200 mm and each of which (i) had a length of 500 mm and (ii) included 30 circular injection holes provided at regular intervals and having a diameter of 5 mm. A distance between the base substrate and the respective injection holes was set to 50 mm, and an angle formed by an injection axis line of each of the injection holes with a line normal to the base substrate was set to 0°.

An exhaust section included 20 exhaust vent rows which were provided at intervals of 200 mm and each of which (i) had a length of 500 mm and (ii) included 20 circular exhaust vents provided at regular intervals and having a diameter of 15 mm. A distance between the base substrate and the respective exhaust vents was set to 150 mm.

The base substrate having a catalyst thereon was placed on a mesh belt of the production apparatus. An aligned CNT aggregate was produced on the base substrate while a transfer speed of the mesh belt was being changed. Conditions for each section of the production apparatus were set similar to those of Example 1.

Example 3

An aligned CNT aggregate was produced by causing the production apparatus described in <Embodiment 3> to successively carry out a process including the formation step and the growth step.

An injection section included 20 injection hole rows which were provided at intervals of 200 mm and each of which (i) had a length of 500 mm and (ii) included 30 circular injection holes provided at regular intervals and having a diameter of 5 mm. A distance between the base substrate and the respective injection holes was set to 50 mm, and an angle formed by an injection axis line of each of the injection holes with a line normal to the base substrate was set to 0°.

An exhaust section included 20 exhaust vent rows which were provided at intervals of 200 mm and each of which (i) had a length of 500 mm and (ii) included 20 circular exhaust vents provided at regular intervals and having a diameter of 15 mm. A distance between the base substrate and the respective exhaust vents was set to 150 mm.

The base substrate having a catalyst thereon was placed on a mesh belt of the production apparatus. An aligned CNT aggregate was produced on the base substrate while a transfer speed of the mesh belt was being changed. Conditions for each section of the production apparatus were set similar to those of Example 1.

[Comparison of Produced Aligned CNT Aggregates]

Uniformity of the aligned CNT aggregates produced by the production apparatuses of the present invention was evaluated by measuring a distribution of G/D ratios. A raman spectrum of the aligned CNT aggregates was measured by using a microlaser raman system (Raman RXN1 Analyzer 532 manufactured by Kaiser Optical Systems, Inc.) and irradiating a surface of the aligned CNT aggregates with a laser beam having a wavelength of 532 nm. The measurement was carried out at 25 points which are arranged on the surface in a grid pattern so that 5 points are arranged at regular intervals in each of vertical and horizontal directions of the surface having a size of 500 mm×500 mm. FIGS. 7 through 12 show distributions of G/D ratios of the aligned CNT aggregates produced in Examples 1 through 3.

Examples 1 through 3 each made it possible to obtain, at any point on a base substrate, a CNT having a high G/D ratio. According to Examples 1 and 2, there is a slight gradient in the distributions of the G/D ratios due to a temperature of a raw material gas and a heating history. Meanwhile, according to Example 3, there is a less steep gradient in the distributions of the G/D ratios.

Further, the aligned CNT aggregates produced in each of the Examples 1 through 3 of the present invention had the other properties of: a weight per base substrate area of 1.7 to 1.8 mg/cm$^2$, a density of 0.025 to 0.03 g/cm$^3$, an average external diameter of 2.8 to 3.0 nm (half width: 2 nm), a carbon purity of 99.9%, a Hellman's orientation coefficient of 0.7, and an average specific surface area, measured based on a BET method with use of a BET specific area measuring apparatus (HM model-1210 manufactured by MOUNTECH Co., Ltd.), of 1100 to 1200 m$^2$/g.

INDUSTRIAL APPLICABILITY

An aligned CNT aggregate obtained by the production method in accordance with the present invention is suitably usable in fields of, for example, electronic device materials, optical element materials, and conductive materials.

REFERENCE SIGNS LIST 10, 20, 30 Growth Unit
11 Growth Furnace
12, 32', 32" Injection Section
12a Injection Hole
13 Exhaust Section
13a Exhaust Vent (Second Exhaust Vent)
14 Mounting Surface
15 Exhaust Vent (First Exhaust Vent)
100 CNT Production Apparatus (Apparatus for producing an aligned carbon nanotube aggregate)
111 Base Substrate

The invention claimed is:

1. A method for producing an aligned carbon nanotube aggregate by synthesizing the aligned carbon nanotube aggregate on a base substrate that supports a catalyst on a surface thereof, the method comprising:
   a growth step of synthesizing the aligned carbon nanotube aggregate on the base substrate by supplying a raw material gas for carbon nanotubes to the catalyst and heating at least either the catalyst or the raw material gas, the growth step being carried out by a growth unit, the growth unit including:
      at least one injection section including a plurality of pipes extending parallel to the base substrate, wherein each of the pipes is provided with an injection hole row in which a plurality of injection holes, from which the raw material gas is injected to the base substrate, are aligned;
      a first exhaust vent being on one side, relative to the at least one injection section, while a mounting surface on which the base substrate is placed is on the other side relative to the injection section, for exhausting, out of a growth furnace, the raw material gas that was injected from the plurality of injection holes and then contacted the base substrate, the growth furnace storing the base substrate while the aligned carbon nanotube aggregate is being synthesized; and
      an exhaust plate that includes a plurality of second exhaust vents aligned in exhaust vent rows and that exhaust, towards the first exhaust vent, the raw material gas that contacted the base substrate, the exhaust vent rows being alternatingly located between adjacent ones of the injection hole rows,
   the exhaust plate being provided so as to be closer to the first exhaust vent than the plurality of pipes.

2. The method as set forth in claim 1, wherein the supply of the raw material gas in the growth step includes supplying a catalyst activation material.

3. The method as set forth in claim 1, wherein the pipes extend parallel to each other.

4. The method as set forth in claim 1, wherein the plurality of injection holes face the base substrate.

5. The method as set forth in claim 1, wherein the exhaust plate is separated from the plurality of pipes.

* * * * *